United States Patent
Han et al.

(10) Patent No.: US 9,640,507 B2
(45) Date of Patent: May 2, 2017

(54) BONDING METHOD, BONDING APPARATUS, AND METHOD FOR MANUFACTURING SUBSTRATE

(71) Applicants: Ilyoung Han, Uiwang-si (KR); Kyoungran Kim, Suwon-si (KR); Donggil Shim, Bucheon-si (KR); Youngjoo Lee, Seoul (KR); Byunggon Kim, Seoul (KR); Byeongkap Choi, Seoul (KR)

(72) Inventors: Ilyoung Han, Uiwang-si (KR); Kyoungran Kim, Suwon-si (KR); Donggil Shim, Bucheon-si (KR); Youngjoo Lee, Seoul (KR); Byunggon Kim, Seoul (KR); Byeongkap Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 250 days.

(21) Appl. No.: 14/261,489

(22) Filed: Apr. 25, 2014

(65) Prior Publication Data

US 2015/0053350 A1  Feb. 26, 2015

(30) Foreign Application Priority Data

Aug. 22, 2013 (KR) .......................... 10-2013-0099766

(51) Int. Cl.
  *B32B 41/00* (2006.01)
  *H01L 23/00* (2006.01)
  (Continued)

(52) U.S. Cl.
  CPC ........ *H01L 24/81* (2013.01); *H01L 21/67092* (2013.01); *H01L 21/67766* (2013.01);
  (Continued)

(58) Field of Classification Search
  CPC ......... H01L 24/81; H01L 24/83; H01L 24/94; H01L 24/97; H01L 24/75;
  (Continued)

(56) References Cited

U.S. PATENT DOCUMENTS 4,209,355 A  6/1980 Burns
4,607,779 A  8/1986 Burns
(Continued)

FOREIGN PATENT DOCUMENTS

JP        07-283372 A    10/1995
KR  10-2013-0018090 A    2/2013

OTHER PUBLICATIONS

Keith A et al., Flip Chip Die Bonding: An Enabling Technology for 3DIC Integration, 2009, pp. 55-59.
(Continued)

*Primary Examiner* — George Koch
(74) *Attorney, Agent, or Firm* — Volentine & Whitt, PLLC

(57) ABSTRACT

A bonding method for bonding a semiconductor chip to an underlying structure includes aligning an electrical contact of a lower surface of the semiconductor chip with an electrical connection member of an upper surface of the underlying structure, the electrical contact at least partially encased by a support material. The method further includes first heating the semiconductor chip and the underlying structure, deforming the electrical contact, and curing the support material encasing the deformed electrical contact. The method still further includes second heating the semiconductor chip and the underlying structure to bond the electrical contact of the semiconductor chip to the electrical connection member of the underlying structure while maintaining the support material in a cured state.

8 Claims, 45 Drawing Sheets

(51) Int. Cl.
*H01L 21/67* (2006.01)
*H01L 21/677* (2006.01)
*H01L 25/065* (2006.01)
*H01L 25/00* (2006.01)
H01L 21/66 (2006.01)
H01L 25/18 (2006.01)

(52) U.S. Cl.
CPC .............. *H01L 24/75* (2013.01); *H01L 24/83* (2013.01); *H01L 24/94* (2013.01); *H01L 24/97* (2013.01); *H01L 25/0657* (2013.01); *H01L 25/50* (2013.01); *H01L 22/12* (2013.01); *H01L 25/18* (2013.01); *H01L 2224/13101* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/759* (2013.01); *H01L 2224/7598* (2013.01); *H01L 2224/75251* (2013.01); *H01L 2224/75252* (2013.01); *H01L 2224/75745* (2013.01); *H01L 2224/75803* (2013.01); *H01L 2224/75804* (2013.01); *H01L 2224/75823* (2013.01); *H01L 2224/81203* (2013.01); *H01L 2224/81815* (2013.01); *H01L 2224/81948* (2013.01); *H01L 2224/83203* (2013.01); *H01L 2224/83855* (2013.01); *H01L 2224/83948* (2013.01); *H01L 2225/06513* (2013.01); *H01L 2225/06517* (2013.01); *H01L 2225/06565* (2013.01)

(58) Field of Classification Search
CPC ......... H01L 21/67092; H01L 21/67766; H01L 22/12; H01L 2224/759; H01L 2224/13101; H01L 2224/83948; H01L 2224/75251; H01L 2224/81948; H01L 2224/81203; H01L 2224/75252; H01L 2224/75804; H01L 2224/81815; H01L 2224/7598; H01L 2224/83855; H01L 2224/75803; H01L 2224/75745; H01L 2224/75823; H01L 2224/32225; H01L 2224/16225; H01L 2224/73204; H01L 2224/16145; H01L 2224/83203; H01L 2224/32145

USPC ........ 156/359, 581; 100/11, 211; 269/40, 43
See application file for complete search history.

(56) References Cited

U.S. PATENT DOCUMENTS

| | | |
|---|---|---|
| 6,993,346 B2 | 1/2006 | Matsuyama |
| 7,491,625 B2 | 2/2009 | Bayan et al. |
| 2003/0073381 A1* | 4/2003 | Mallery ............ H01L 21/67253 451/5 |
| 2006/0292753 A1* | 12/2006 | Takahashi ............. H01L 21/561 438/127 |
| 2008/0035274 A1* | 2/2008 | Kanisawa ................. B30B 5/02 156/583.1 |
| 2012/0313647 A1 | 12/2012 | Carpenter et al. |
| 2013/0037950 A1 | 2/2013 | Yu et al. |

OTHER PUBLICATIONS

Martin L. Culpepper et al, Design of a Miniature Dual-Purpose Positioner-Fixture for Six-Axis Scanning and Detachable Fixturing in NanoInstrumentation, 2006.

Gilbert Lecarpentier et al, High Accuracy Placement, In-situ Reflow or Thermo-Compression Bonding Enabling High Density and Fine Pitch in 3D-IC with Chip to Wafer Bonding Approach, 5th Int'l Conference & Exhibit on Device Packaging, Mar. 13, 2009, pp. 1-30.

Kartik M et al, A dual-purpose positioner-fixture for precision six-axis positioning and precision fixturing Part I. Modeling and design, Precision Engineering 31, 2007, 276-286.

* cited by examiner (First Heating Step)

(Cooling Step)

BONDING METHOD, BONDING APPARATUS, AND METHOD FOR MANUFACTURING SUBSTRATE

CROSS-REFERENCE TO RELATED APPLICATIONS

A claim of priority under 35 U.S.C. §119 is made to Korean Patent Application No. 10-2013-0099766, filed on Aug. 22, 2013, in the Korean Intellectual Property Office, the entire contents of which are hereby incorporated by reference.

BACKGROUND

Example embodiments of the inventive concept relate to apparatus and methods for manufacturing a substrate, and in particular, to apparatus and methods for bonding a semiconductor chip to an underlying structure such as a wafer, a printed circuit board, or another semiconductor chip.

As the electronic industry matures, demand continues for high-performance, high-speed and compact electronic systems. In response, packaging technologies have evolved in an effort to enhance the integration degree and reliability of semiconductor devices and systems.

As a result, a large variety of semiconductor packaging systems have been proposed, some of which require execution of a bonding process. For example, methods have been suggested for stacking a plurality of semiconductor chips on a substrate within a single package. Here, a bonding process may be used to connect the substrate to a semiconductor chip and/or to connect stacked semiconductor chips to each other via connection terminals (e.g., solders and pads). As another example, methods have been suggested for stacking a plurality of such packages to produce a so-called "package-on-package (PoP)" device. Again, a bonding process may be used to connect the packages with each other and/or to a mother board of the PoP device.

SUMMARY

According to example embodiments of the inventive concept, a bonding method for bonding a semiconductor chip to an underlying structure is provided. The method includes aligning an electrical contact of a lower surface of the semiconductor chip with an electrical connection member of an upper surface of the underlying structure, the electrical contact at least partially encased by a support material. The method further includes first heating the semiconductor chip and the underlying structure, deforming the electrical contact, and curing the support material encasing the deformed electrical contact. The method still further includes second heating the semiconductor chip and the underlying structure to bond the electrical contact of the semiconductor chip to the electrical connection member of the underlying structure while maintaining the support material in a cured state.

The underlying structure may be a substrate, or another semiconductor chip.

The first heating may be carried out at a first temperature which is higher than a melting temperature of the support material, and the electrical contact may be deformed while the support material is a melted state.

The support material may be cured by heating at a second temperature to polymerize the support material. The first temperature may be the same as the second temperature, and the first heating and the curing may together constitute a continuous heat treatment.

The first heating and the deforming may be carried out in a first apparatus, and the curing may be carried out in a second apparatus. The second apparatus is a batch processing apparatus, and the method may further include loading the semiconductor chip and the underlying structure into a container after the first heating and the deforming, and transferring the container to the batch processing apparatus to carry out the curing.

The second heating may be carried out at a third temperature which is higher than a melting temperature of the electrical contact and lower than a melting temperature of the cured support material.

The curing and the second heating may be carried out in separate apparatus.

The electrical contact may be a solder material.

The first and second temperatures may be less than a melting temperature of the electrical contact.

The support material may be one of a non-conductive film, a non-conductive paste, an anisotropic conductive film, and an anisotropic conductive paste.

The deforming may include forming a contact pressure between the semiconductor chip and the underlying structure during the first heating.

The semiconductor chip may supported by a first support stage and the underlying structure may be supported by a second support stage, and the first heating, the curing and the second heating may be carried out by controlling respective temperatures of the first and second support stages.

The semiconductor chip and the underlying structure may be pressurized between the first and second support stages during the first heating, the curing, and the second heating.

According to other example embodiments of the inventive concept, a bonding method for bonding a semiconductor chip to an underlying structure is provided. The method includes aligning an electrical contact of a lower surface of the semiconductor chip with an electrical connection member of an upper surface of the underlying structure, the electrical contact at least partially encased by a support material in an uncured state. The method further includes first heating the semiconductor chip and the underlying structure at a first constant temperature for a first period of time, wherein the first constant temperature is higher than a melting temperature of the support material in the uncured state and lower than a melting temperature of the electrical contact. The method further includes deforming the electrical contact during the first period of time. The method still further includes second heating the semiconductor chip and the underlying structure at a second constant temperature for a second period of time, wherein the second constant temperature is higher than a melting temperature of the electrical contact and lower than a melting point of the support material in a cured state.

The first heating and the deforming may be carried out in a chamber of a first apparatus, and the second heating may be carried out in a chamber of a second apparatus.

The support material may be one of a non-conductive film, a non-conductive paste, an anisotropic conductive film, and an anisotropic conductive paste, and the first constant temperature may be between 100 and 150° C., both inclusive.

The electrical contact may be solder, and the second constant temperature may be between 220 and 300° C., both inclusive.

A ratio of a duration of the first period of time to a duration of the second period of time may be between 5:1 and 30:1, both inclusive, and the duration of the first period of time may be between 5 and 30 minutes, both inclusive.

According to still other example embodiments of the inventive concept, a bonding apparatus is provided which includes a controller and a process chamber including an upper stage, a lower stage, a heat source, and a drive mechanism for moving the lower stage relative to the upper stage. The controller is configured to control the heat source and the drive mechanism to execute a bonding process in which an electrical contact of a lower surface of a semiconductor chip is bonded with an electrical connection member of an upper surface of an underlying structure, the electrical contact at least partially encased by a support material, the bonding process executed by the controller including controlling the heat source to first heat the semiconductor chip and the underlying structure located on the lower stage, controlling the drive mechanism to pressurize the semiconductor chip and the underlying structure between the lower stage and the upper stage so as to deform the electrical contact, controlling the heat source to cure the support material support material encasing the deformed electrical contact, and controlling the heat source to second heat the semiconductor chip and the underlying structure to bond the electrical contact of the semiconductor chip to the electrical connection member of the underlying structure while maintaining the support material in a cured state.

The heat source may include at least one heating element contained in each of the lower and upper stages.

According to yet other example embodiments of the inventive concept, a bonding system is provided which includes a first apparatus and a second apparatus. The first apparatus includes a first controller and a first process chamber, the first process chamber including an upper stage, a lower stage, a heat source, and a drive mechanism for moving the lower relative to the upper stage. The second apparatus includes a second controller and a second process chamber, the second process chamber including an upper stage, a lower stage, a heat source, and a drive mechanism for moving the lower relative to the upper stage. The first controller is configured to control the heat source and the drive mechanism of the first process chamber to execute a first portion of a bonding process, the bonding process for bonding an electrical contact of a lower surface of a semiconductor chip with an electrical connection member of an upper surface of the underlying structure, the electrical contact at least partially encased by a support material, the first portion of the bonding process executed by the first controller including controlling the heat source of the first process chamber to first heat the semiconductor chip and the underlying structure located on the lower stage, controlling the drive mechanism of the first process chamber to pressurize the semiconductor chip and the underlying structure between the lower stage and the upper stage of the first process chamber so as to deform the electrical contact, and controlling the heat source of the first process chamber to cure the support material support material encasing the deformed electrical contact. The second controller is configured to control the heat source and the drive mechanism of the second process chamber to execute a second portion of the bonding process, the second portion of the bonding process executed by the second controller including controlling the heat source of the second process chamber to second heat the semiconductor chip and the underlying structure to bond the electrical contact of the semiconductor chip to the electrical connection member of the underlying structure while maintaining the support material in a cured state.

The first controller may be configured to maintain a constant first temperature in the first process chamber during the first portion of the bonding process, and the second controller may be configured to maintain a constant second temperature in the second process chamber during the second portion of the bonding process, the second constant temperature being higher than the first constant temperature.

According to other example embodiments of the inventive concept, a support stage configured to support at least one semiconductor device in a processing apparatus is provided. The support stage includes a support body including a support surface, and an elastic plate located on the support surface of the support body. The support surface of the support body includes a plurality of indentations or protrusions which inhibit lateral expansion of the elastic plate when the elastic plate is subjected to pressure by the at least one semiconductor device.

The processing apparatus may be a bonding apparatus.

The support plate may be a rubber material.

The support surface may include the protrusions each having a protrusion surface confronting the elastic body, and at least one protrusion surface among the protrusions may include a plurality of indentations.

The support surface may include the protrusions each having a protrusion surface confronting the elastic body, and the protrusions may be arranged such that the protrusion surfaces respectively align with upper surfaces of a plurality of semiconductor devices simultaneously processed by the processing apparatus.

The support surface may include the protrusions each having a protrusion surface confronting the elastic body, and the support stage further may further include vacuum holes in the protrusion surface of the protrusions, respectively. Additional vacuum holes may be included in the support surface between the protrusions.

According to still other example embodiments of the inventive concept, a bonding apparatus is provided which includes a chamber, an upper stage located in the chamber, the upper stage including a support body having a support surface, and an elastic plate located on the support surface of the support body. The bonding apparatus further includes a lower stage, a heating mechanism configured to control a temperature within the chamber, and a pressure mechanism configured to control a pressure between the upper and lower stages. The support surface of the support body includes a plurality of indentations or protrusions which inhibit lateral expansion of the elastic plate when the elastic plate is subjected to pressure by at least one semiconductor device pressurized between the upper and lower stages by the pressure mechanism.

The heating mechanism may include a first heat source configured to set a temperature of the lower stage, and a second heat source configured to set a temperature of the upper stage independently of the lower stage.

The support surface may include the protrusions each having a protrusion surface confronting the elastic body, and the support stage may further include vacuum holes in the protrusion surface of the protrusions, respectively. The bonding apparatus may further include a vacuum pump configured to suction the elastic plate to the support surface via the vacuum holes.

BRIEF DESCRIPTION OF THE DRAWINGS

The above and other aspects and features of the inventive concept will become readily apparent from the detailed description that follows, with reference to the accompanying drawings which illustrate non-limiting, example embodiments as described herein.

DETAILED DESCRIPTION

Figure 1:
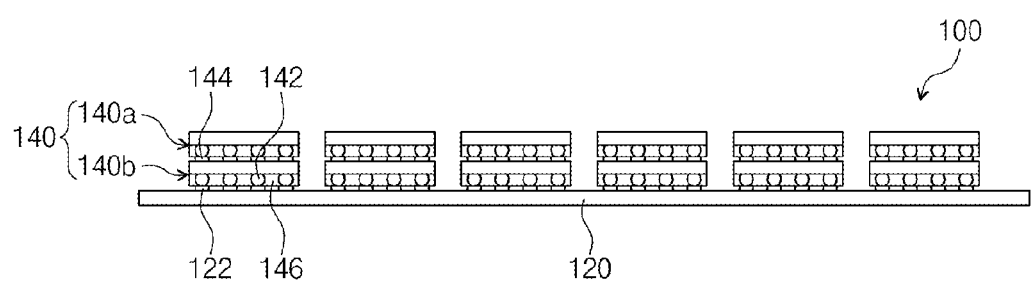
FIGS. 1, 2, 3 and 4 are schematic diagrams illustrating respective examples of a substrate to be treated (referred to herein as a "treatment substrate").

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

The afore-described drawings are intended to illustrate the general characteristics of methods, structure and/or materials utilized in certain example embodiments and to supplement the written description provided below. These drawings may not, however, be to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature. Where an element or feature has been previously described in the context of an earlier presented embodiment, another description of the same or similar element or feature may be omitted in the context of a later presented embodiment.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, various examples of a treatment substrate (i.e., a substrate to be treated) according to example embodiments of the inventive concept will be described with reference to FIGS. 1 through 4. In each of the illustrated examples, the treatment substrate includes an underlying substrate having one or more semiconductor chips mounted thereon. It will be understood, however, that the inventive concept is not limited to these specific examples.

FIG. 1 is a schematic diagram illustrating an example of a treatment substrate 100.

In the example of FIG. 1, a substrate 120 has a plurality of semiconductor chip structures 140 mounted thereon. Here, as an example, the substrate 120 is a semiconductor wafer which may be circular. As shown, each of the chip structures 140 of this example includes a plurality of stacked semiconductor chips, namely, a lower semiconductor chip 140a atop which an upper semiconductor chip 140b is stacked. The semiconductor chips 140a and 140b may, for example, be memory chips. The semiconductor wafer 120 of this example includes pads 122 at each of chip stack mounting locations on a top surface thereof. Each pad 122 may serve as an electrical connection member. Each of the upper and lower semiconductor chips 140a and 140b may include electrical connection members 142 on bottom surfaces thereof, and each lower semiconductor chip 140b may include electrical connection members 144 on an upper surface thereof. In example embodiments, the electrical connection members 142 on bottom surfaces of the semiconductor chips 140a and 140b are formed of solder (e.g., solder balls or bumps), and the electrical connection members 144 on the top surface of the semiconductor chip 140b are pads. Although not shown, pads 144 may also be provided on the top surfaces of the upper semiconductor chips 140a. The solder 142 of the lower semiconductor chips 140b is disposed to be in contact with respective pads 122 of the wafer 120, and the solder 142 of an upper semiconductor chip 140a is disposed to be in contact with respective pads 144 of the lower semiconductor chips 140b.

In addition, still referring to FIG. 1, a support material 146 (referred to herein as a joint member 146) may be provided on bottom surfaces of the semiconductor chips 140a and 140b which partially encases the electrical connection members 142. For example, in the case where the electrical connection members 142 are solder balls or bumps, the joint member 146 may surround each of the solder balls or bumps, while at the same time exposing lower surfaces of the solder balls or bumps to allow connection to the underlying pads 122. In example embodiments, the joint member 146 may be a non-conductive film (NCF), such as a wafer level NCF. Alternatively, as other examples, the joint member 146 may be non-conductive paste, anisotropic conductive film, or anisotropic conductive paste.

Figure 2:
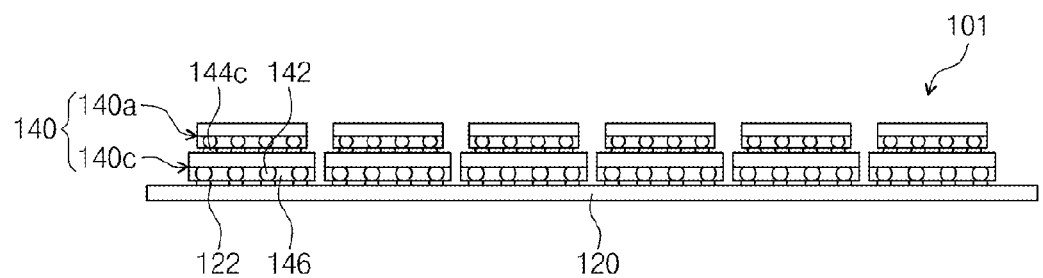

FIG. 2 is a schematic diagram illustrating other example of a treatment substrate 101.

In particular, FIG. 2 represents an example in which each of the semiconductor chip structures 140 include different type of semiconductor chips 140a and 140c stacked one on the other. For example, the upper semiconductor chips 140a may be memory chips and the lower semiconductor chips 140c may be controller chips 140c. Alternatively, as another example, the upper semiconductor chips 140a may be controller chips and the lower semiconductor chips 140c may be memory chips 140c. Otherwise, the configuration of FIG. 2 is the same as that of FIG. 1 described above, and thus further description of FIG. 2 is omitted here to avoid redundancy.

Figure 3:
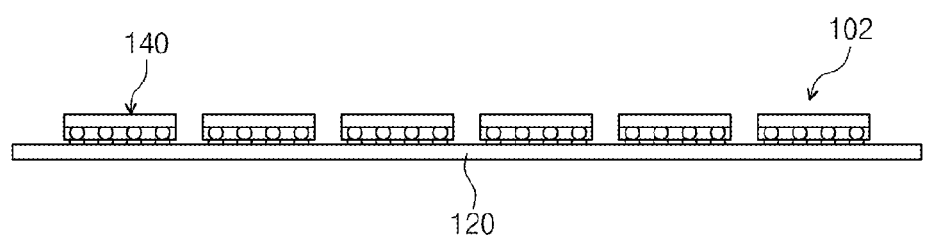

FIG. 3 is a schematic diagram illustrating still other example of a treatment substrate 102.

In particular, FIG. 3 represents an example in which the semiconductor chip structures 140 each contain a single semiconductor chip that is mounted to an underlying semiconductor substrate 120. The semiconductor chip structures 140 may, as examples, be controller chips or memory chips or a combination thereof. Otherwise, the configuration of FIG. 3 is the same as that of FIG. 1 described above, and thus further description of FIG. 3 is omitted here to avoid redundancy.

Figure 4:
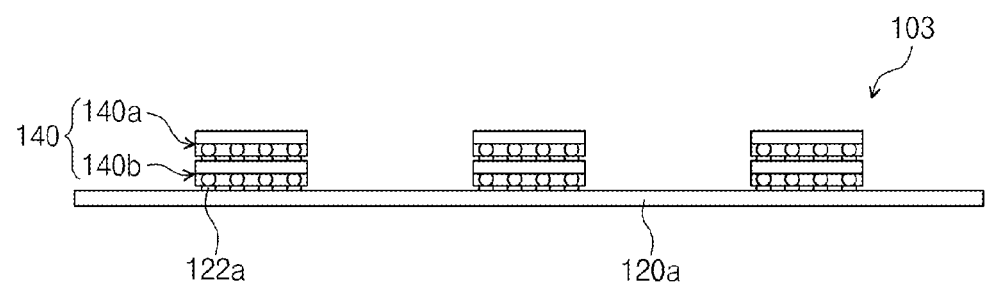

FIG. 4 is a schematic diagram illustrating yet another example of a treatment substrate 103.

In particular, FIG. 4 represents an example in which the underlying structure is a printed circuit board (PCB) 120a (rather than, for example, a semiconductor wafer). PCB pads 122a are provided on a top surface of the printed circuit board 120a, and the semiconductor chip structures 140 are mounted thereto. Otherwise, the configuration of FIG. 4 is the same as that of FIG. 1 described above, and thus further description of FIG. 4 is omitted here to avoid redundancy.

As mentioned previously, the inventive concepts are not limited to the specific examples of FIGS. 1 through 4, and it will be understood that a multitude of variations are possible. Further, it will be understood that the number of semiconductor chip structures 140 mounted to a single wafer 120 (or PCB 120a) may range from several hundred to several thousand. In addition, the number of chips stacked within each semiconductor chip structure 140 may range from several ten to several hundred.

Figure 5:
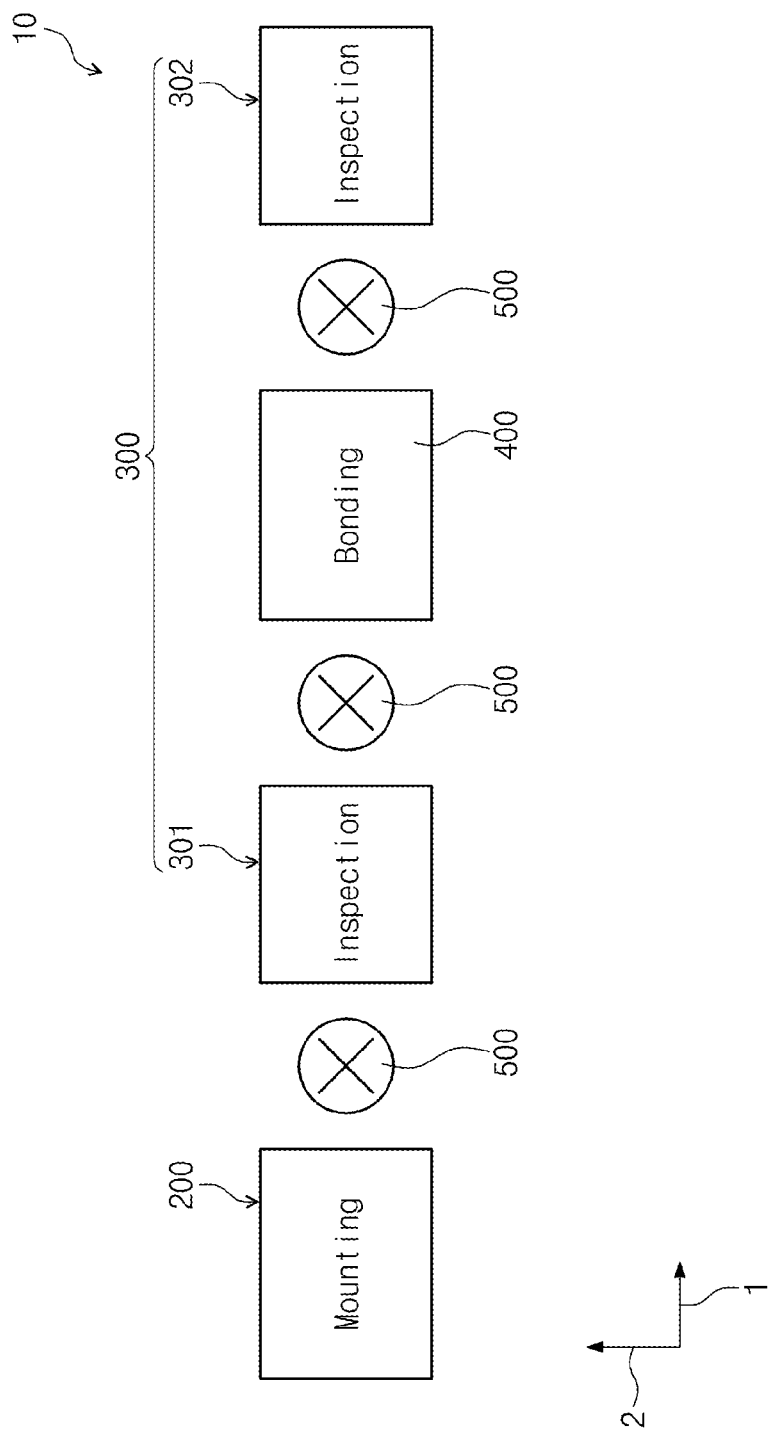
FIG. 5 is a schematic diagram illustrating an example of a substrate-manufacturing system according to example embodiments of the inventive concept.

FIG. 5 is a schematic diagram illustrating an example of a substrate-manufacturing system according to example embodiments of the inventive concept.

Referring to FIG. 5, as well as FIGS. 1 through 4, a substrate-manufacturing system 10 may include a mounting apparatus 200, an inspection apparatus 300, and a bonding apparatus 400. The mounting apparatus 200 may be configured to perform a mounting process for mounting the semiconductor chip structures 140 on the substrate 120 (or PCB 102a). For example, the bonding apparatus 400 may be configured to bond the electrical connection members 142 to the pads 122 and 144 in the configuration of FIG. 1. The inspection apparatus 300 may include a mounting inspection unit 301 and a bonding inspection unit 302. Again referring to the example of FIG. 1, the mounting inspection unit 301 may be configured to examine whether proper alignment has been achieved during the mounting process between the semiconductor chip structure 140 and the substrate 120 and/or between the stacked semiconductor chips 140a and 140b. The bonding inspection unit 302 may be configured to examine whether proper alignments have been maintained after the bonding process. Alternatively, the substrate-manufacturing system 10 may be configured without the mounting inspection unit 301 and/or the bonding inspection unit 302.

In certain examples, the mounting apparatus 200, the mounting inspection unit 301, the bonding apparatus 400, and the bonding inspection unit 302 may be disposed adjacent to each other. Carrier units 500 for carrying the treatment substrate 100 may be provided between the mounting apparatus 200 and the mounting inspection unit 301, between the mounting inspection unit 301 and the bonding apparatus 400, and between the bonding apparatus 400 and the bonding inspection unit 302. The mounting apparatus 200, the inspection apparatus 300, and the bonding apparatus 400 may be sequentially disposed in a row along a first direction 1 of FIG. 5. Alternatively, the mounting apparatus 200 and the inspection apparatus 300 may be disposed along the first direction 1, and the inspection apparatus 300 and the bonding apparatus 400 may be disposed along a second direction 2 of FIG. 5. Here, the first and second directions 1 and 2 may be orthogonal to each other when viewed from above. Alternatively, the mounting apparatus 200, the inspection apparatus 300, and the bonding apparatus 400 may be disposed apart from each other, and in this case, the treatment substrate 100 may be transferred from one of the apparatuses to another via a container (for example, a container 4700 of FIG. 52 described later). The container may be configured to store temporarily a plurality of the treatment substrates 100. As examples, the container may be a magazine configured to contain printed circuit boards or a front opening unified pod (FOUP) configured to contain wafers.

Figure 6:
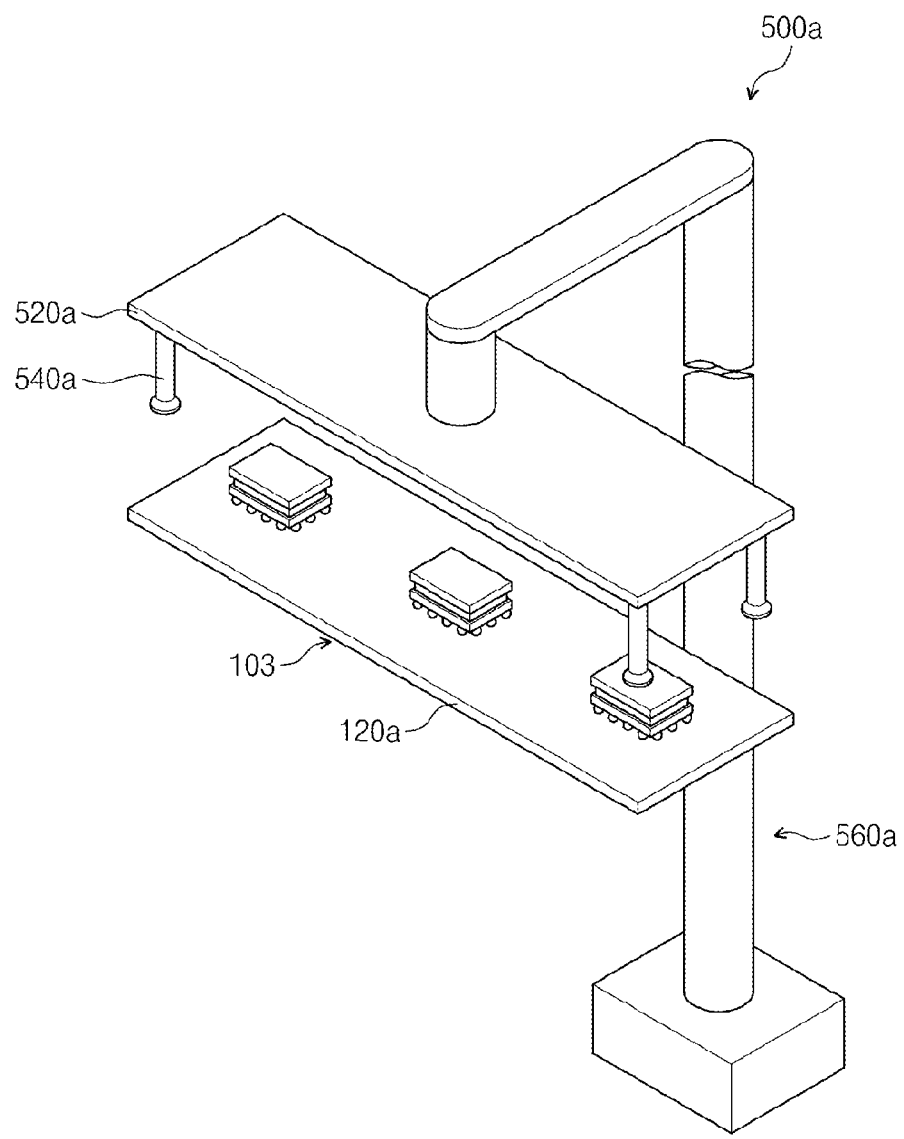
FIG. 6 is a perspective view schematically illustrating an example of a carrier unit shown in FIG. 5.

FIG. 6 is a perspective view schematically illustrating an example of a carrier unit 500 of FIG. 5.

The carrier unit of FIG. 6 may be utilized, for example, in the case where the substrate is a printed circuit board such as the PCB 120a of FIG. 4. Referring to FIG. 6, the carrier unit 500 may include a handler 500a. The handler 500a may include a base 520a, vacuum pads 540a, and a base actuator 560a. The base 520a may take the form of a plate. The vacuum pads 540a may be provided on a bottom surface of the base 520a so as to protrude downward from the base 520a. In this example, four vacuum pads 540a are aligned at four corners of the substrate 120a to exert a pulling force to the substrate 120a. The base 520a may be linearly moved along a vertical or horizontal direction or be rotated by the base actuator 560a.

Figure 7:
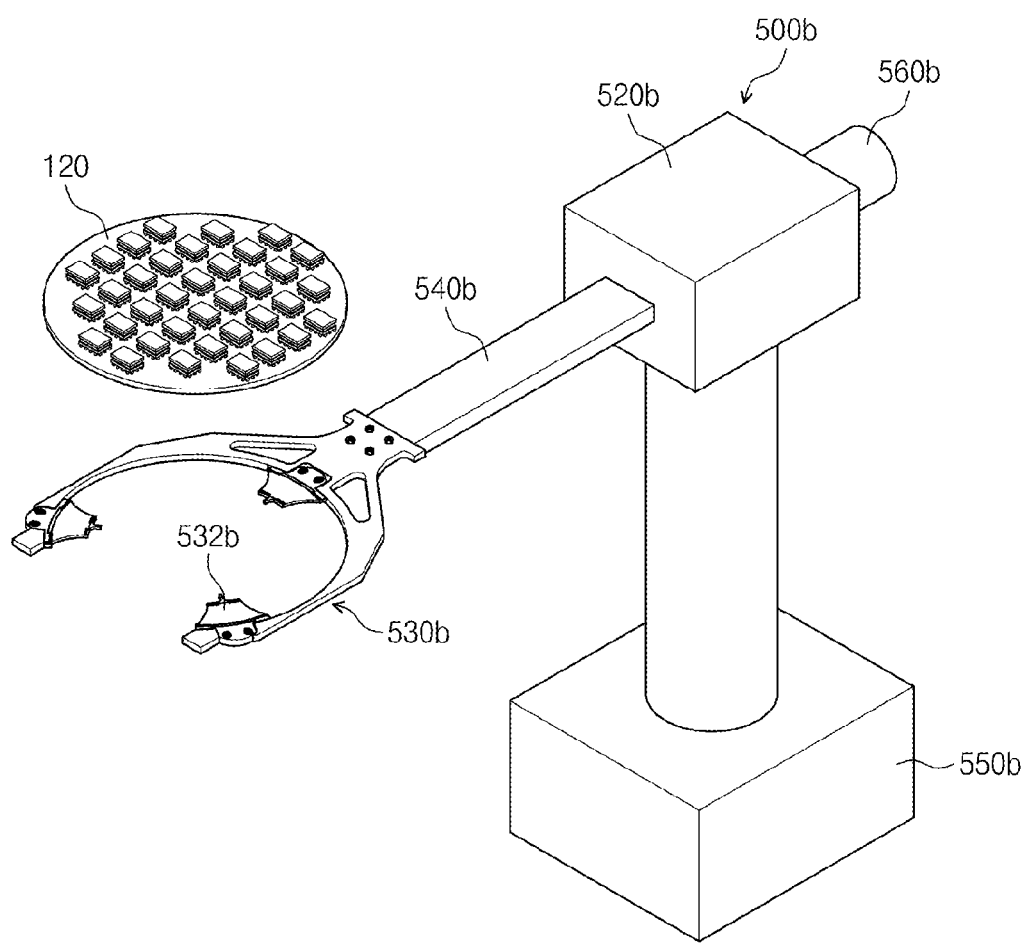
FIG. 7 is a perspective view schematically illustrating other example of a carrier unit shown in FIG. 5.

FIG. 7 is a perspective view schematically illustrating other example of a carrier unit of FIG. 5.

The carrier unit of FIG. 7 may be utilized, in the case where the substrate is a wafer such as the wafer 120 of FIG. 1. Referring to FIG. 7, the carrier unit 500 may include a carrier robot 500b. The carrier robot 500b may include a base 520b, a hand 530b, an arm 540b, a base actuator 550b, and an arm actuator 560b. The base 520b may be shaped like a rectangular parallelepiped box. The arm 540b may extend forward from the base 520b, and the hand 530b may be fixedly connected to an end portion of the arm 540b. The hand 530b may be configured to support a bottom surface of the substrate 120. The hand 530b may have substantially a front-open circular ring shape. A supporting element 532b may be provided on an inner side surface of the hand 530b to support an edge portion of a bottom surface of the substrate 120. The arm 540b may be moved (or expanded and contracted) along the horizontal direction by the arm actuator 560b. The base 520b may be moved along the vertical direction by the base actuator 560b.

The structure and/or shape of the carrier unit 500 may not be limited to the specific examples of FIGS. 6 and 7, and instead may be modified in a multitude of different ways. For example, the carrier unit 500 may be a rail or conveyor configured to linearly transfer the treatment substrate. Further, the carrier units 500 of FIG. 5 may have different configurations from one another.

Returning to FIG. 5, the mounting apparatus 200 may be configured to mount already fabricated semiconductor chip structures 140 containing chip stacks on the substrate 120. Alternatively, referring to FIGS. 1 and 2 for example, the mounting apparatus 200 may be configured to first mount the lower semiconductor chips 140b (or 140c) on the substrate 120, and then mount the upper semiconductor chips 140a on the lower semiconductor chips 140b (or 140c).

The mounting inspection unit 301 may have a structure which is the same as or substantially the same as the bonding inspection unit 302. In certain examples, in the mounting inspection unit 301 and the bonding inspection unit 302, an optical system may be used to examine whether the semiconductor chip structure 140 is properly aligned relative to the substrate 120 and 120a, and whether the semiconductor chips 140a and 140b (or 140c) are properly aligned relative to each other.

Figure 8:
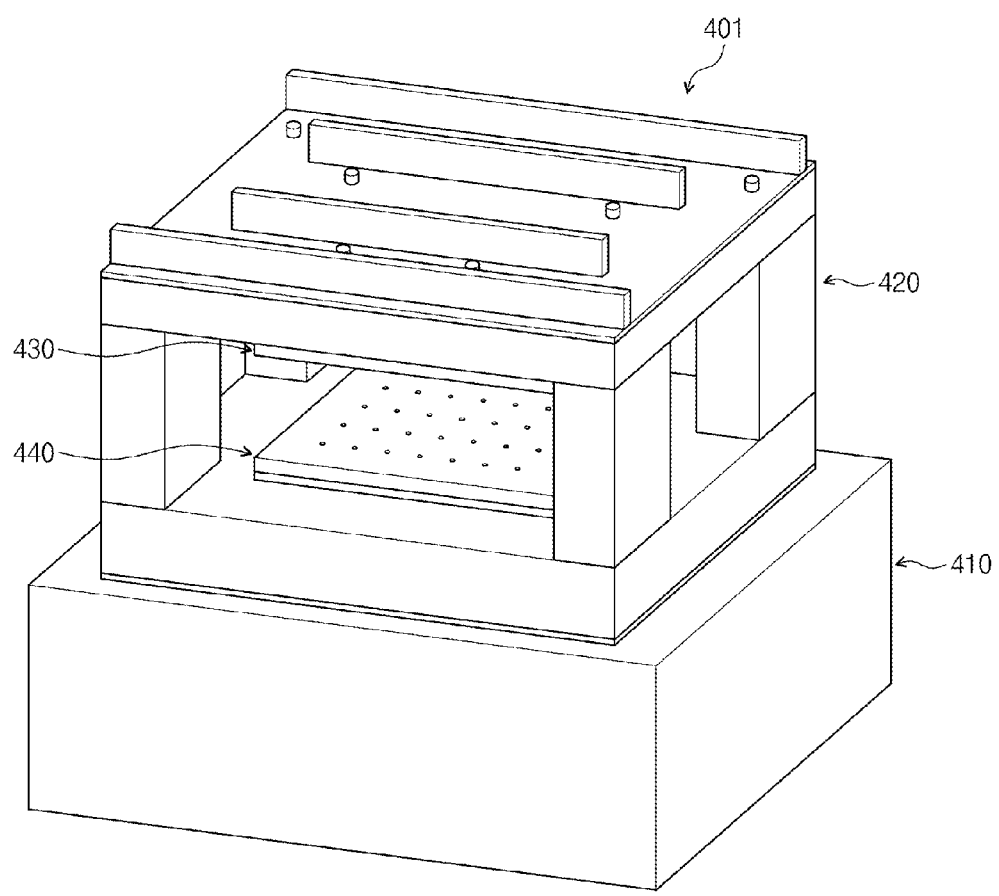
FIG. 8 is a perspective view schematically illustrating an example of a bonding unit that may be included in a bonding apparatus shown in FIG. 5.

FIG. 8 is a perspective view schematically illustrating an example of a bonding unit 401 which may be included in the bonding apparatus 400 of FIG. 5.

Referring to FIG. 8, the bonding unit 401 may include a base 410, a frame 420, a top stage 430, and a bottom stage 440. Although not shown in FIG. 8, but as will be described later, the bonding unit 401 may also include a heating member (e.g., 460 of FIG. 11), a pressing member (e.g., 500 of FIG. 11), and a controller (e.g., 470 of FIG. 11). The base 410 may be configured to support the frame 420. The base 410 and the frame 420 may be configured to provide a space in which the bonding process can be performed. The top stage 430, the bottom stage 440, the pressing member, and the heating member may be configured to heat and press a treatment substrate in the bonding process. As will be described later, the controller may control the heating member and the pressing member in such a way that a sequence of bonding steps to be applied to the treatment substrate are carried out at given process conditions (e.g., a heating sequence, a heating temperature, a pressing sequence, and a pressing force).

Figure 9:
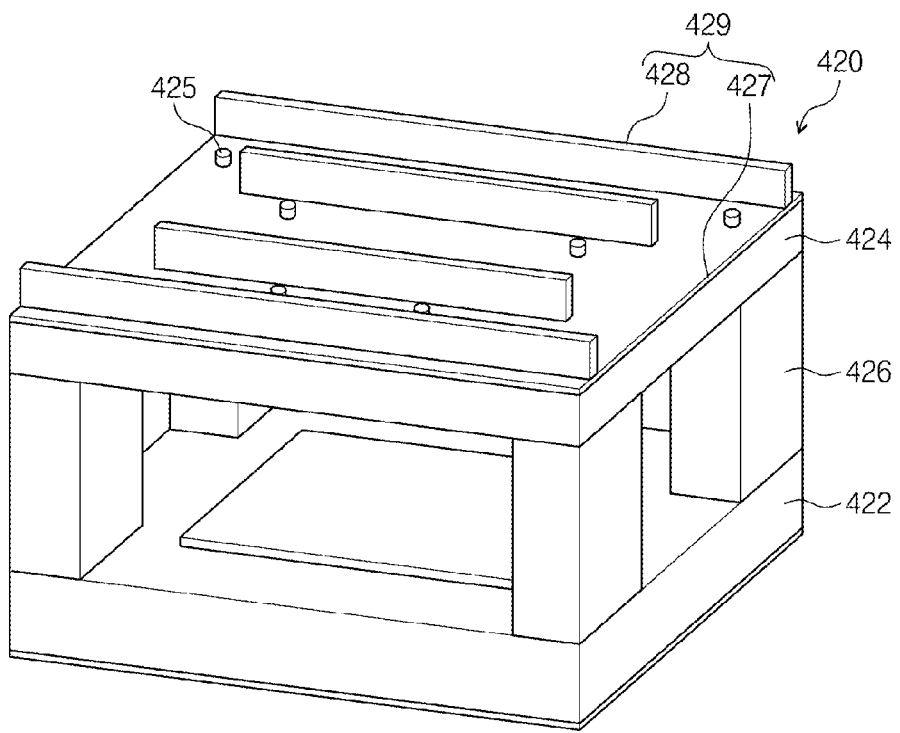
FIG. 9 is a perspective view illustrating an example of a frame shown FIG. 8.

FIG. 9 is a perspective view illustrating an example of a frame 420 of FIG. 8.

Referring to FIG. 9, the frame 420 may include a lower plate 422, an upper plate 424, and pillars 426. The lower plate 422 and the upper plate 424 may be shaped like a rectangle, and sizes thereof may be similar to each other. The lower plate 422 and the upper plate 424 may be vertically spaced apart from each other so as to face each other. The lower plate 422 and the upper plate 424 may be connected by the pillars 426. For example, four pillars 426 may be provided at corners of each of the lower and upper plates 422 and 424. The lower plate 422, the upper plate 424, and the pillar 426 may be formed of a material exhibiting relatively small deformation and having relatively high modulus or rigidity. In certain examples, the lower plate 422, the upper plate 424, and the pillar 426 may be formed of a granitic material.

The lower plate 422 or the upper plate 424 may be equipped with a stiffening plate 429. The stiffening plate 429 may be configured to enhance a tensile strength of the lower plate 422 or the upper plate 424. The stiffening plate 429 may be formed of steel. The stiffening plate 429 may include a flat plate 427 being in contact with the lower plate 422 or the upper plate 424 and a rib 428 protruding from the flat plate 427 to an outward direction of the pillar 426. Plural ribs 428 may be provided as shown in the example of FIG. 9. The ribs 428 may be disposed parallel to and spaced apart from each other. The stiffening plate 429 may be provided on each of the lower plate 422 and the upper plate 424. The stiffening plate 429 may be fixed to the lower plate 422 or the upper plate 424 by a stud bolt 425. Alternatively, the stiffening plate 429 may be provided on only one of the lower plate 422 and the upper plate 424.

Figure 10:
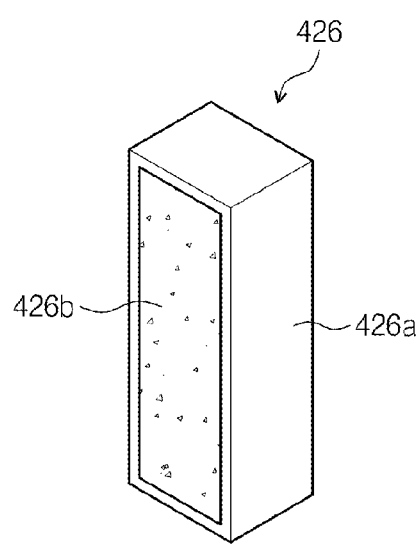
FIG. 10 is a perspective view illustrating an example of a vertical section of a pillar shown FIG. 9.

FIG. 10 is a perspective view illustrating an example of a vertical section of a pillar 426 of FIG. 9.

Referring to FIG. 10, the pillar 426 may include an exterior body 426a and a filling material 426b. The exterior body 426a may define an exterior appearance of the pillar 426 and delimit an inner space isolated from the outside thereof. The filling material 426b may be provided in the inner space delimited by the exterior body 426a. The filling material 426b may be formed of a different material from the exterior body 426a. The filling material 426b may be formed of a material having a relatively high modulus or high rigidity. In certain examples, filling material 426b may be formed of concrete or polymer concrete.

Figure 11:
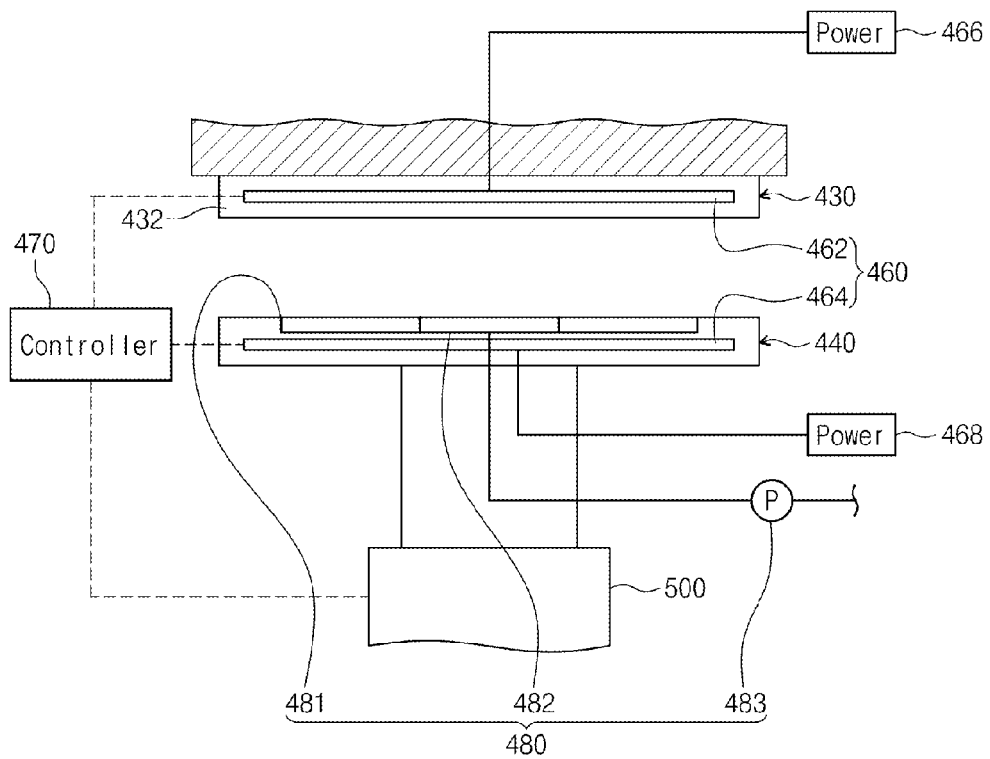
FIG. 11 is a sectional view schematically illustrating examples of a top stage, a bottom stage, a heating member, and a pressing member shown in FIG. 8.

FIG. 11 is a sectional view schematically illustrating an example of a bonding unit which may be included in the bonding apparatus 400 of FIG. 5.

The top stage 430 of this example includes a plate-shaped body 432 which is fixed to the frame 420. The body 432 may be provided in the form of a rectangular plate. Alternatively, the body 432 may be provided in the form of a circular plate. The body 432 may have a substantially flat bottom surface. The bottom stage 440 of this example is configured to support one or more treatment substrates. In the case where the underlying structure of the treatment substrate is a semiconductor wafer, the bottom stage 440 may be configure to support a single treatments substrate, although the inventive concepts are not limited thereto. In the case where the underlying structure of the treatment substrate is a PCB, the bottom stage 440 may be configure to support one or more than one treatment substrate. As shown, the top stage 430 and the bottom stage 440 face each other, and confronting surfaces thereof may or may not have the same area. The bottom stage 440 and the top stage 430 may, as examples, be formed of ceramics or aluminum-based materials. The bottom stage 440 and the stop stage 430 may be configured to vertically move relative to each other. For example, the bottom stage 440 may be provided on the base 410 in such a way that it can be moved upward from the base 410.

The heating member 460 is configured to heat the treatment substrate 100 during a bonding process. In the example of FIG. 11, the heating member 460 includes a top heater 462 and a bottom heater 464 located in the top stage 430 and bottom stage 440, respectively. The top and bottom heaters 462 and 464 may be configured in such a way that heating temperatures thereof are independently controlled. The top heater 462 may be connected to an upper power 466, and the bottom heater 464 may be connected to a lower power 468. The upper power 466 and the lower power 468 may be controlled by a controller 470. Alternatively, the top and bottom heaters 462 and 464 may be connected to one power supply. One or both of top and bottom heaters 462 and 464 may be provided in the form a plate heater which may, for example, be formed of a mica plate.

Figure 12:
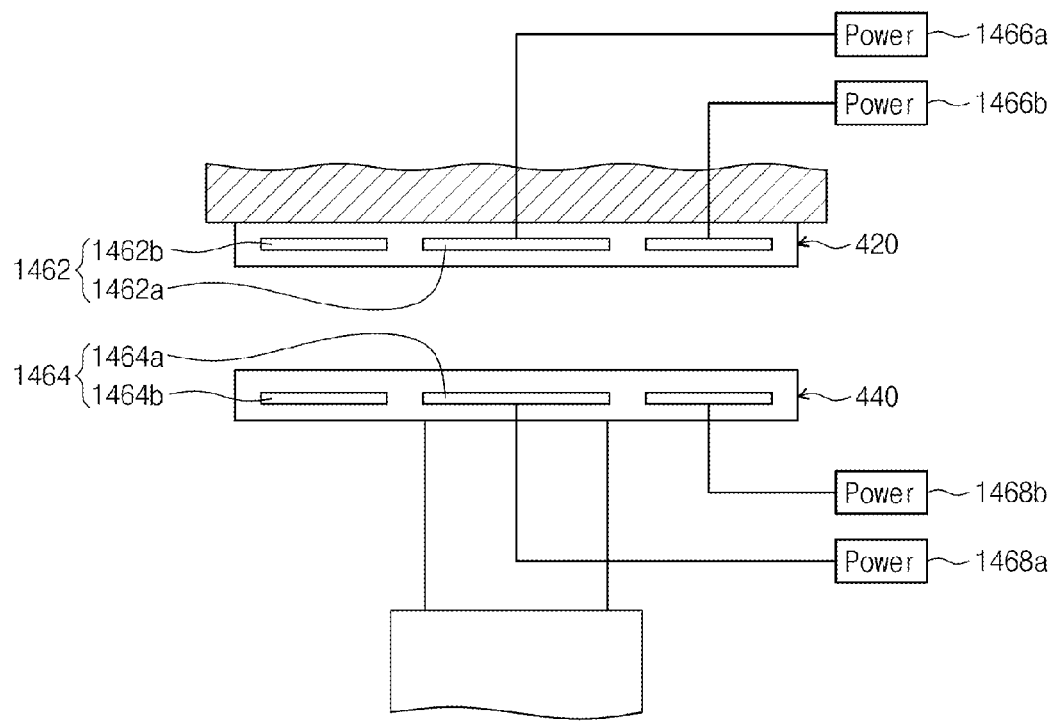
FIG. 12 is a schematic diagram illustrating other example of the heating member shown in FIG. 11.

FIG. 12 is a schematic diagram for reference in explaining another example of the heating member of FIG. 11.

Referring to FIG. 12, a heating member of this example includes a top heater 1462 and a bottom heater 1464. Each of the top and bottom heaters 1462 and 1464 may include a plurality of heating elements, at least some of which may be separately controllable. For example, in FIG. 12, the top and bottom heaters 1462 and 1464 include center heaters 1462a and 1464a, respectively, and edge (or periphery) heaters 1462b and 1464b, respectively. The edge heaters 1462b and 1464 are driven by power sources 1466b and 1468b, respectively. The center heaters 1462a and 1464a are driven by power sources 1466a and 1468a, respectively. The center heaters 1462a and 1464a may be positioned at a central region of the top stage 420 or the bottom stage 440, and the edge heaters 1462b and 1464b may be positioned at a periphery region of the top stage 420 or the bottom stage 440. Also, the edge heaters 1462b and 1464b may be disposed as a ring to surround the center heaters 1462a and 1464a, respectively. Each of the center and edge heaters 1462a, 1464a, 1462b, and 1464b may be configured in such a way that a heating temperature thereof is controlled in an independent manner. Also, at least one intermediate heater (not shown) may be provided between the center heater 1462a or 1464a and the edge heater 1462b or 1464b. The intermediate heater may also be provided in the form of a ring. Alternatively, a plurality of intermediate heaters may be joined together to constitute a ring-shaped structure. In another example, one of the top and bottom heaters may be configured to include a plurality of heaters, while the other may be configured to include one heater.

Referring back to FIG. 11, a fastening system 480 may be provided in the bottom stage 440 to fasten the treatment substrate. In certain examples, the fastening system 480 is configured to suction the treatment substrate to a top surface of the bottom stage 440 using vacuum pressure. One or plural vacuum apertures 481 may be formed on the top surface of the bottom stage 440, and one or plural vacuum lines 482 may be formed in the bottom stage 440 and connected to respective vacuum apertures 481. The vacuum lines 482 may be connected to a decompression device 483 which may, for example, be a vacuum pump. The treatment substrate may be suctioned by the vacuum holes 481 and thereby fixed to the bottom stage 440.

Figure 13:
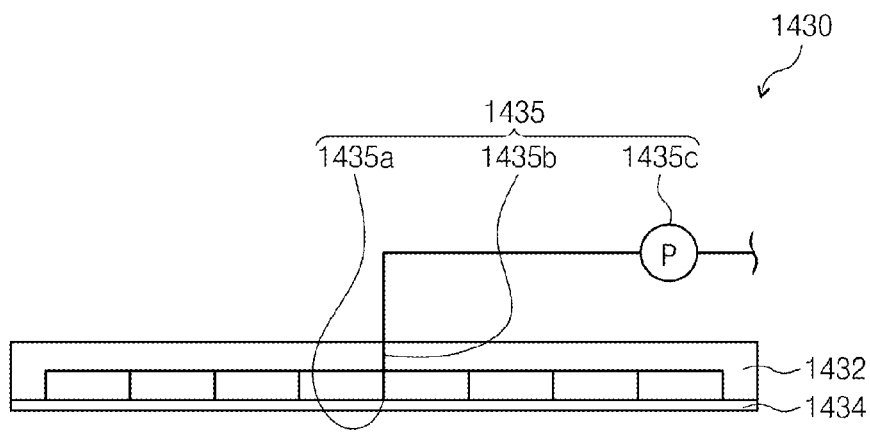
FIGS. 13, 14, 15, 16 and 17 are schematic diagrams illustrating other respective examples of the top stage shown in FIG. 11.

FIG. 13 is a schematic diagram illustrating another example of the top stage of FIG. 11.

Referring to FIG. 13, a top stage 1430 of this example includes a body 1432 and an elastic plate 1434. The body 1432 may be configured to have substantially the same or similar features as the body 432 of FIG. 11. The body 1432 may thus have the form of a relatively rigid plate-like member and the elastic plate 1434 may have the form of a sheet as shown in the figure. Therefore, the elastic plate 1434 may be referred to as an elastic sheet to differentiate it, in terms of its description, over the more plate-like body 1432. The elastic plate 1434 may be provided below the body 1432, and may have a size corresponding or the same as that of the body 1432. In certain examples, the elastic plate 1434 is provided in the form of a rubber plate, i.e., a sheet of rubber, which exhibits favorable heat-resistant properties. Referring to FIG. 1 as an example, in the case where the semiconductor chip structures 140 have differences in height resulting from fabrication variations, different pressures may be exerted on different ones of the semiconductor chip structures 140 when the treatment substrate 100 is pressed between top and bottom stages. The absorbing characteristics of the elastic plate 1434 may be effective in mitigating or minimizing these pressure differences.

The elastic plate 1434 may be fastened to the body 1432 by a fastening system 1435. In certain examples, the fastening system 1435 may suction the elastic plate 1434 to the body 1432 using vacuum pressure. One or plural vacuum apertures 1435a may be formed in a bottom surface of the body 1432, and vacuum lines 1435b may be formed in the top stage 1430 and connected to respective ones of the vacuum hole 1435a. The vacuum lines 1435b may be connected to a decompression member 1435c, such as a vacuum pump. Alternatively, as other examples, the elastic plate 1434 may be fixed to the body 1432 using an adhesive layer or a mechanical clamp.

Figure 14:
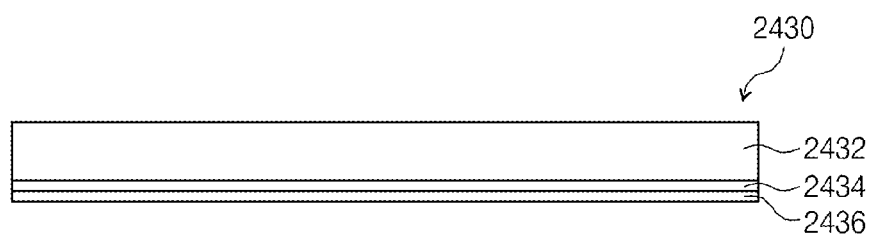

FIG. 14 is a schematic diagram illustrating still other example of the top stage of FIG. 11.

Referring to FIG. 14, a top stage 2430 of this example includes a body 2432, an elastic plate 2434, and a contact sheet 2436. The body 2432 and the elastic plate 2434 may be configured the same as or substantially the same as the body 1432 and the elastic plate 1434, respectively, of FIG. 13. The contact sheet 2436 may be disposed below the elastic plate 2434. The contact sheet 2436 may be formed of a material, whose rigidity is higher than that of the elastic plate 2434. In certain examples, the contact sheet 2436 may be formed of a fluorine-resin based material. For example, the contact sheet 2436 may be formed of poly tetra fluoro ethylene. The contact sheet 2436 may facilitate separation of the treatment substrate from the top stage 2430 after processing. In addition, the contact sheet 2436 may be replaceable/disposable so as to maintain the cleanliness of the elastic plate 2434. In certain examples, the contact sheet 2436 may be provided to have a size corresponding to or the same as that of the elastic plate 2434, and be fastened to the elastic plate 1434. Alternatively, the contact sheet 2436 may be disposed spaced apart in a downward direction from the elastic plate 2434, and when the treatment substrate is pressed, the contact sheet 2436 may come into contact with the elastic plate 2434 by a resulting pressing force.

Figure 15:
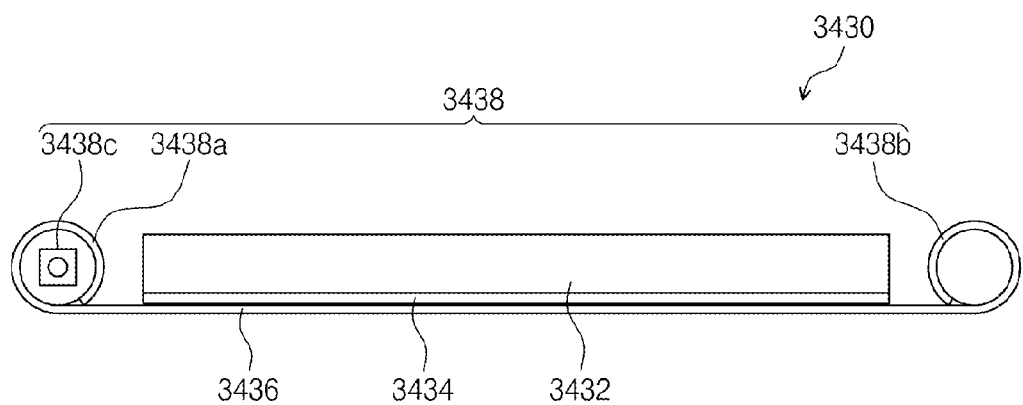

FIG. 15 is a schematic diagram illustrating yet another example of the top stage of FIG. 11.

Referring to FIG. 15, a top stage 3430 of this example includes a body 3432, an elastic plate 3434, a contact sheet 3436, and an exchange member 3438. The body 3432 and the elastic plate 3434 may be configured in the same or substantially the same way as the body 2432 and the elastic plate 2434, respectively, of FIG. 14. The contact sheet 3436 may be formed of substantially the same or similar material as the contact sheet 2436 of FIG. 14. However, in contrast to FIG. 14, the contact sheet 3436 of FIG. 15 is configured to have a length that is greater than that of the elastic plate 3434. The contact sheet 3436 may be polluted by fumes or contaminants produced in the bonding process. The exchange member 3438 of this example is configured to replace a polluted region of the contact sheet 3436 below the elastic plate 3434 with an unused/clean region of the contact sheet 3436.

In this particular example, the exchange member 3438 includes an unwinding roller 3438a, a winding roller 3438b, and an actuator 3438c. The unwinding roller 3438a and the winding roller 3438b may be disposed spaced apart from each other with the elastic plate 3434 interposed therebetween. The contact sheet 3436 may be wound on the unwinding roller 3438a, and an end portion of the contact sheet 3436 may be fastened to the winding roller 3438b. The actuator 3438c may be coupled to the winding roller 3438b to rotate the winding roller 3438b. As the winding roller 3438b is rotated, the contact sheet 3436 may be unwound from the unwinding roller 3438a and, then transported toward the winding roller 3438b. After performing the bonding process a predetermined number of times (i.e., one or more times), the exchange member 3438 may exchange a region of the contact sheet 3436 that is vertically positioned below the elastic plate 3434. Alternatively, a contamination level of a used region of the contact sheet 3436 may be monitored, and if the contamination level is deemed to be higher than a predetermined level, the exchange member 3438 may be configured replace the used region of the contact sheet 3436 with an unused region of the contact sheet 3436.

Figure 16:
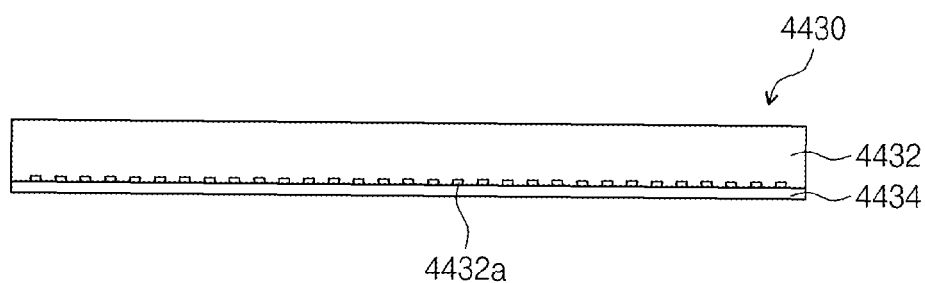

FIG. 16 is a schematic diagram illustrating yet other example of a top stage of FIG. 11.

Referring to FIG. 16, a top stage 4430 of this example includes a support body 4432 and an elastic plate 4434. The body 4432 and the elastic plate 4434 may be configured to have the same or substantially the same features as the body 1432 and the elastic plate 1434 of FIG. 13 described previously. However, unlike previous embodiments, a support surface of the body 4432 of FIG. 16 includes a plurality of indentations or protrusions which inhibit lateral expansion of the elastic plate 4434 when the elastic plate 4434 is subjected to pressure by the at least one semiconductor device.

That is, as shown in FIG. 16, the body 4432 may include indentations 4432a formed in a bottom surface thereof. The indentations 4432a of this example are dispersed over an entire bottom surface (i.e., support surface) of the body 4432. In a bonding process, a treatment substrate is pressed against the top stage 4430, and the resultant pressure can cause lateral expansion of the elastic plate 4434. In the case where the treatment substrate includes semiconductor chips, for example, lateral expansion of the elastic plate 4143 can result in lateral displacement of the semiconductor chips. In this case, misalignment between the semiconductor chips and underlying substrate and/or between semiconductor chips of a stake may occur. The indentations 4432a formed in the bottom surface of the body 4432 absorb at least some of the pressurized expansion of the elastic plate 4434, thereby inhibiting lateral expansion of the elastic plate 4434 when subjected to pressure by a treatment substrate.

Figure 17:
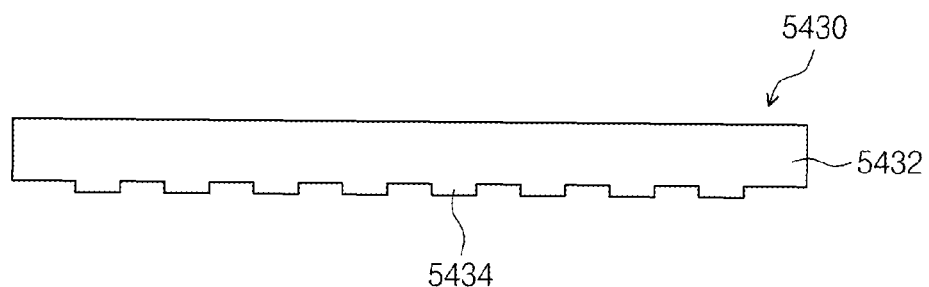

FIG. 17 is a schematic diagram illustrating a further example of the top stage of FIG. 11.

Referring to FIG. 17, the top stage 5430 may includes a support body 5432. Although not shown, the top stage 5430 may optionally include an elastic plate such as any of those described previously. The body 5432 may be configured to have the same or substantially the same features as the body 432 of FIG. 11. In the example of this embodiment, however, the body 5432 includes protrusions 5434 extending downward from a bottom surface thereof. The protrusions 5434 are arranged such lower surfaces thereof are aligned with respective upper surfaces of semiconductor chips of a treatment substrate undergoing a bonding process. In addition, the lower surfaces of the protrusions 5434 may have a same or similar size as that of the upper surfaces of the semiconductor chips. In this manner, when the treatment substrate is pressed against the top stage 5430, the semiconductor chips come in contact with the respective protrusions 5434 of the body 5430. The protrusions 5434 may be effective in concentrating a pressing force on the semiconductor chips when the treatment substrate is pressed. Also, in the case where an elastic plate is used, the protrusions 5434 may be effective in inhibiting lateral expansion of the elastic plate when the treatment substrate is pressed.

Figure 18:
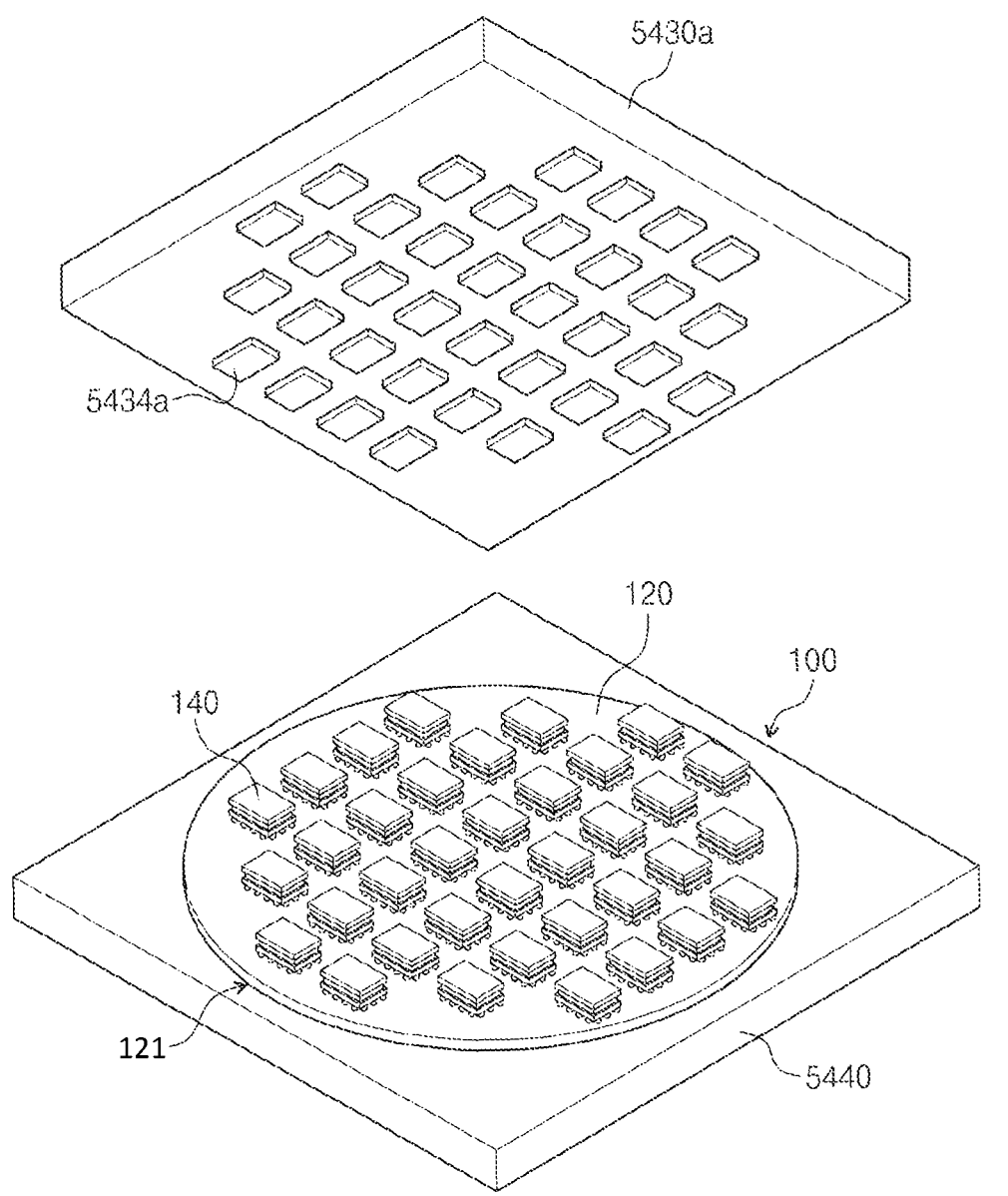
FIG. 18 is a perspective view for describing an example of a top stage of a type shown in FIG. 17.

FIG. 18 is a perspective view showing an example of a treatment substrate 100, a bottom stage 5440, and a top stage 5430a. The treatment substrate 100 of this example includes semiconductor chips 140 to be bonded to a substrate 120 having a circular outer edge 121. The substrate 120 may, for example, be a semiconductor wafer or printed circuit board. It can be seen that the top stage 5430a is an example of the stage 5430 described above in connection with FIG. 17. That is, the top stage 5430a includes protrusions 5434a aligned with semiconductor chips 140.

Figure 19:
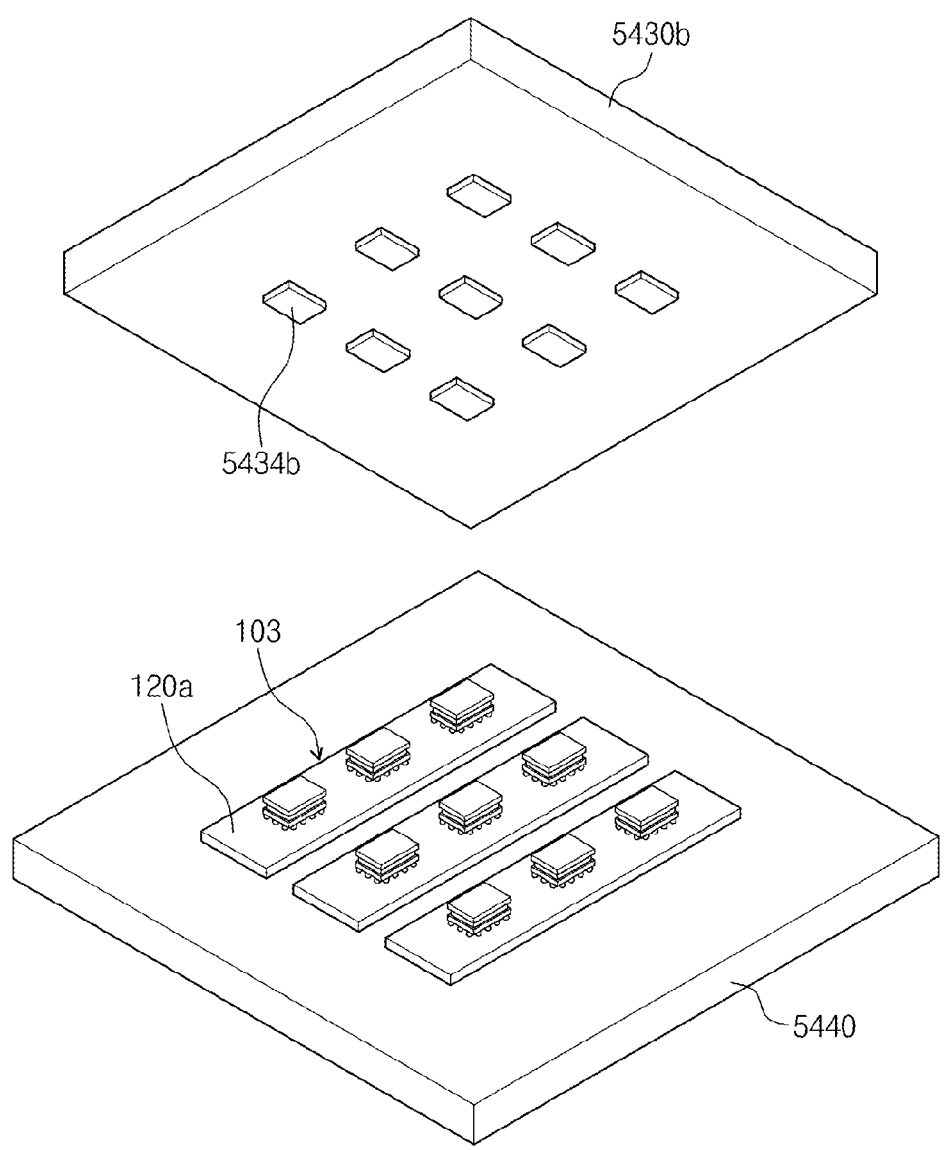
FIG. 19 is a perspective view for describing another example of a top stage of a type shown in FIG. 17.

FIG. 19 is a perspective view illustrating another example of the stage 5430 described above in connection with FIG. 17. Here, the treatment substrate 103 is constituted by three (3) printed circuit boards each having semiconductor chips to be bonded thereto. Reference number 5440 denotes a bottom stage 5440, and reference number 5430b denotes a top stage 5430a having protrusions 5434b that are aligned with the respective semiconductor chips of the treatment substrate 103.

According to embodiments of the inventive concepts, the various top stages describing herein may be configured to be interchangeably attached (by screws, claps, etc.) to the upper plate 424 of the frame 420 of FIG. 9 described previously. Accordingly, the bonding apparatus can readily accommodate treatment substrates of multiple configurations and having differing arrangements of semiconductor chips or chip stacks.

Figure 20:
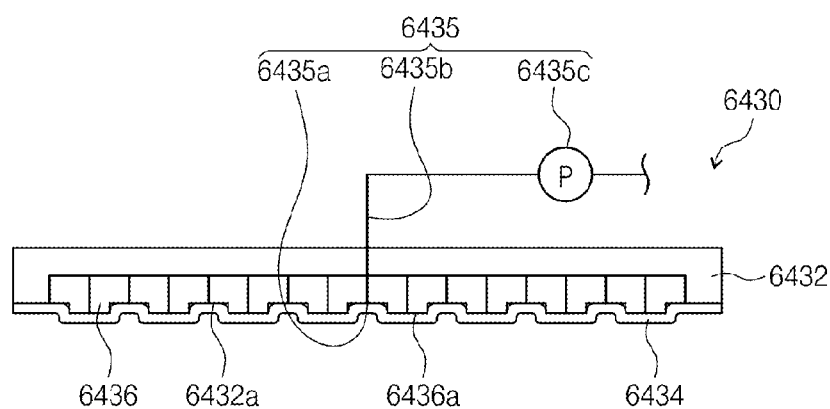
FIG. 20 and FIG. 21 are schematic diagrams illustrating still further respective examples of the top stage shown in FIG. 11.

FIG. 20 is a schematic diagram illustrating still another example of the top stage of FIG. 11.

Referring to FIG. 20, a top stage 6430 of this example includes a support body 6432 and an elastic plate 6434. A bottom surface 6436a of body 6432 includes protrusions 6436 similar to those described previously in connection with FIG. 17. The elastic plate 6434 is positioned below the body 6432, and in this example, the elastic plate 6434 is fixed to the body 6432 by a fastening member 6435. Further, the fastening member 6435 of this example is formed by a vacuum pump (P) 6435c, a vacuum line 6435b, and a plurality of vacuum holes 6435a formed in the body 6432. The vacuum holes 6435a are in communication with the vacuum pump (P) 6435c and a vacuum line 6435b, and open at the bottom surface 6436a of the body 6432. In the example of FIG. 20, a vacuum hole 6435a opens at each protrusion 6436 and at positions between the protrusions 6436. The vacuum pump 6435c, the vacuum line 6435b and the vacuum holes 6435a are operative to suction the elastic plate 6434 to bottom surface 6436a of the body 6432. Further, since the elastic plate 6434 is suctioned and drawn into regions 6432a between the protrusions 6436 as generally shown in FIG. 20, lateral expansion of the elastic plate 6434 is inhibited.

Figure 21:
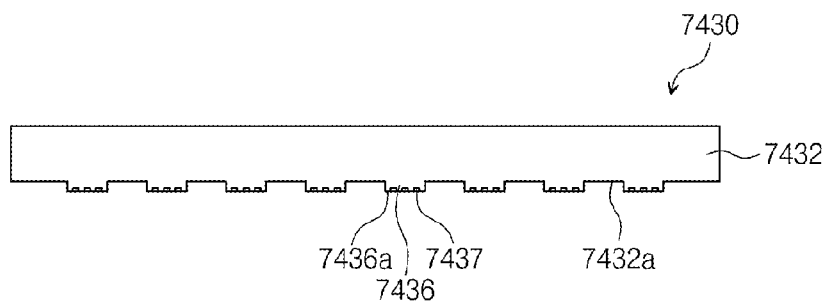

FIG. 21 is a schematic diagram illustrating still another example of the top stage of FIG. 11.

Referring to FIG. 21, a top stage 7430 of this example is similar to that of FIG. 17 described previously in that it includes a support body 7432 having protrusions 7436 at a bottom surface 7432a thereof. However, this example additionally includes indentations 7437 at a bottom surface 7436a of each protrusion 7436 of the body 7432. Although not shown, indentations 7437 may also be formed at the bottom surface 7436a between the protrusions 7436. The indentations 7437 may be effective in inhibiting lateral expansion of an elastic plate during a bonding process.

It is noted that each of the bottom stages 4430, 5430, 5430a, 5430b, 6430, and 7430 of FIGS. 16 through 21 may further include the contact sheet 2436 of FIG. 14 or the contact sheet 3436 and the exchange member 3438 of FIG. 15.

Figure 22:
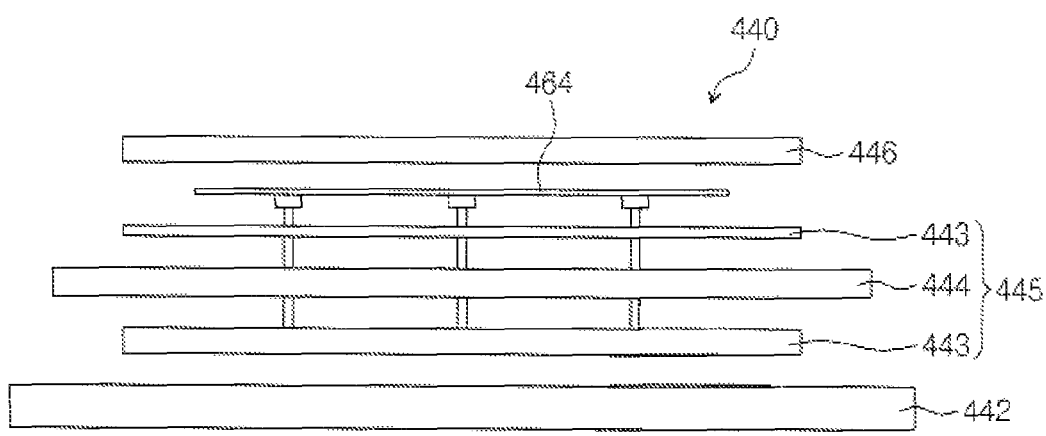
FIG. 22 is a schematic diagram illustrating an example of the bottom stage shown in FIG. 11.

FIG. 22 is a schematic diagram illustrating an example of the bottom stage of FIG. 11. FIG. 22 shows a state in which the components of the bottom stage are exploded or separated from each other.

Referring to FIG. 22, the bottom stage 440 may include a base 442, a heat-insulation member 445, and a chuck plate 446. The base 442, the heat-insulation member 445, and the chuck plate 446 may be sequentially disposed from bottom to top. The bottom heater 464 described above may be disposed between the heat-insulation member 445 and the chuck plate 446. The treatment substrate 100 may be disposed on the chuck plate 446. The heat-insulation member 445 may suppress heat from being emitted from the bottom heater 464 to the base 442. Accordingly, heat emitted from the bottom heater 464 may be concentrated to heat the treatment substrate 100. Further, heat to be emitted from the bottom heater 464 may be used to increase a temperature of the base 442, and thus, the base 442 may be thermally deformed. The heat-insulation member 445 makes it possible to prevent thermal deformation of the base 442.

The heat-insulation member 445 may include a plurality of heat-insulation plates 443 and an intermediate plate 444. The plurality of heat-insulation plates 443 may be sequentially stacked one on the other. The intermediate plate 444 may be disposed between the heat-insulation plates 443 so as to be adjacent to each other. An engineering plastic insulator may be used for the heat-insulation plate 443. For example, the heat-insulation plate 443 may be formed of polyimide or polyether ether ketone (PEEK).

Figure 23:
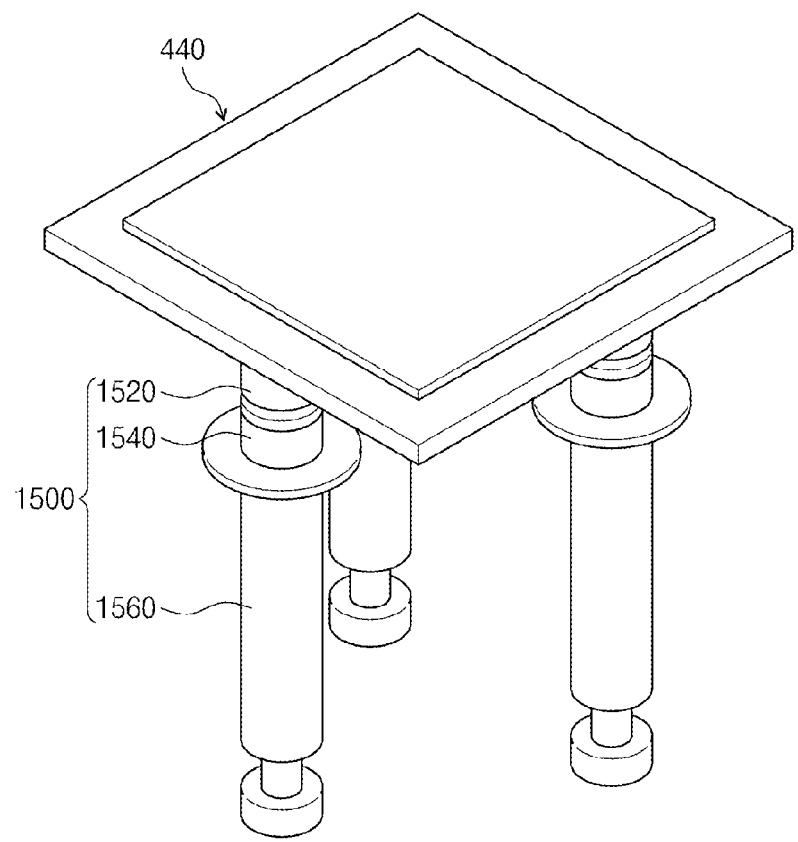
FIG. 23 is a perspective view illustrating an example of the pressing member shown in FIG. 11.

FIG. 23 is a perspective view illustrating an example of the pressing member of FIG. 11.

A pressing member 1500 may be configured to exert a pressing force onto the treatment substrate 100. Referring to FIG. 23, plural pressing members 1500 may be provided, and in this example three (3) pressing members 1500 are provided. Each of the pressing members 1500 may be connected to a bottom surface of the bottom stage 440. The pressing members 1500 may be disposed in a parallel arrangement, and may be arranged equidistant from a central axis of the bottom stage 440. Also, the pressing members 1500 may be disposed to be equiangular to the central axis of the bottom stage 440.

Each pressing member 1500 may include a joint 1520, a load measuring device 1540, and an actuator 1560. The joint 1520 may be positioned to be in contact with the bottom stage 440. The joint 1520 may be configured to allow for horizontal positioning of the bottom stage 440. A ball joint may be used as the joint 1520.

Figure 24:
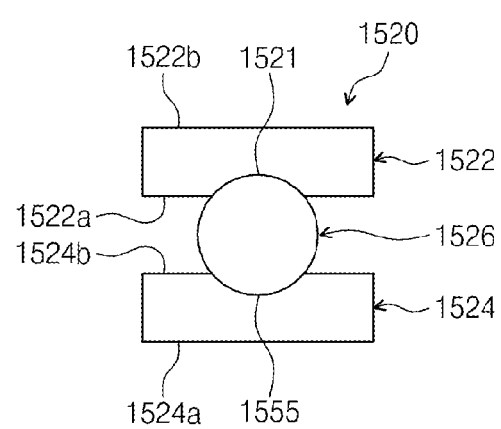
FIG. 24 is a schematic diagram illustrating an example of a joint shown in FIG. 23.

FIG. 24 is a schematic diagram illustrating an example of a joint of FIG. 23.

Referring to FIG. 24, the joint 1520 may include a rotating plate 1522, a fixed plate 1524, and a ball 1526. The rotating plate 1522 and the fixed plate 1524 may be disposed spaced apart vertically each other to face each other. The fixed plate 1524 may be joined to the actuator 1560, and the rotating plate 1522 may be fixedly joined to the bottom stage 440. The fixed plate 1524 may include a bottom surface 1524a and a top surface 1524b. The bottom surface 1524a of the fixed plate 1524 may be substantially flat. An indentation 1555 may be formed on the top surface 1524b of the fixed plate 1524. The indentation 1555 may be provided to have a structure corresponding to a lower region of the ball 1526. The rotating plate 1522 may include a bottom surface 1522a and a top surface 1522b. The top surface 1522b of the rotating plate 1522 may be substantially flat. An indentation 1521 may be formed on the bottom surface 1522a of the rotating plate 1522. The indentation 1521 may be provided to have a structure corresponding to an upper region of the ball 1526. The ball 1526 may be disposed between the rotating plate 1522 and the fixed plate 1524. The upper region of the ball 1526 may be inserted into the indentation 1521 of the rotating plate 1522, and the lower region of the ball 1526 may be inserted into the indentation 1555 of the fixed plate 1524. Due to the presence of the ball 1526, the rotating plate 1522 may be rotated with respect to the fixed plate 1524.

Referring back to FIG. 23 and FIG. 11, the load measuring device 1540 may be configured to measure a pressing force of each pressing member, when the treatment substrate 100 is pressed. The measured pressing force may be converted into electric signals that will be transmitted to the controller 470. A load cell may be used as the load measuring device 1540. The load cell 1540 may be disposed below the joint 1520. The actuator 1560 may vertically move the joint 1520, and thus, the bottom stage 440 may press the treatment substrate 100 with respect to the top stage 430. The actuator 1560 may include a motor. The controller 470 may control a power of the motor in response to a signal transmitted from the load measuring device 1540. The controller 470 may be configured to independently control the actuators 1560 and thereby the power levels of the motors.

According to the embodiment of FIG. 23, since the rotating plate 1522 can be rotated with respect to the fixed plate 1524, it is possible to adjust horizontality the bottom stage 440 supported by the rotating plate 1522. Accordingly, during pressing the treatment substrate 100, the top stage 430 and the bottom stage 440 can be maintained parallel to each other. In addition, each pressing member 500 may be configured to independently control a pressing force to be exerted to the treatment substrate 100 during pressing of the treatment substrate 100, and this makes it possible to exert a uniform pressing force to the semiconductor chips 140 provided on the treatment substrate 100.

In the afore described examples, three pressing members 1500 are illustrated, but two or four or more pressing members 1500 may be provided.

Next, an example of methods of pressing the treatment substrate with the pressing member will be described below.

Figure 25:
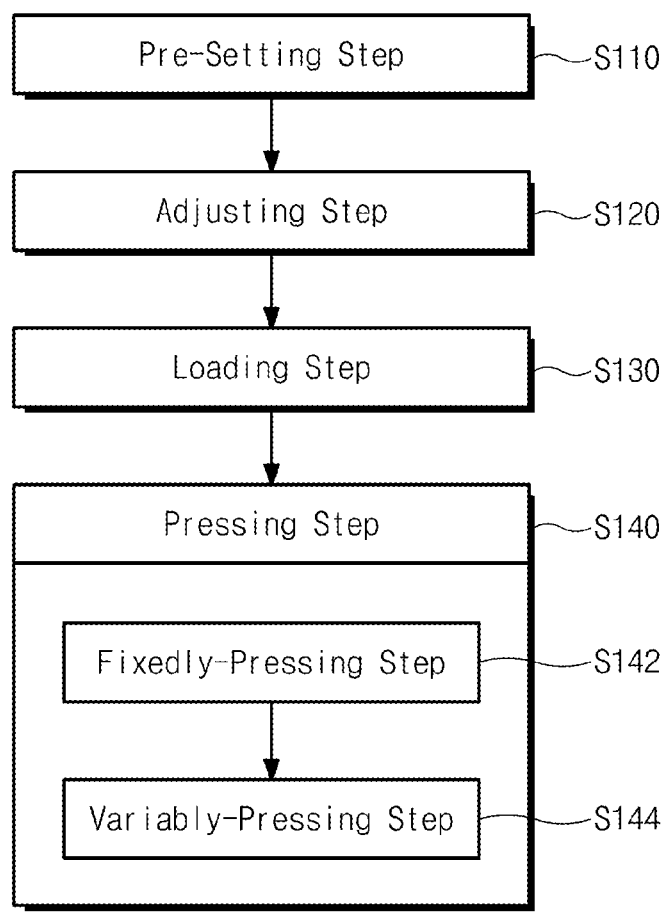
FIG. 25 is a flow chart for reference in describing an example of a pressing process, in which the pressing member shown in FIG. 23 is used to pressurize a treatment substrate.

FIG. 25 is a flow chart illustrating an example of a pressing process, in which the pressing member of FIG. 23 is used to pressurize a treatment substrate, and FIGS. 26 through 30 are diagrams sequentially illustrating an example of a pressing process, in which the pressing member of FIG. 23 is used to pressurize a treatment substrate.

Referring to FIG. 25, the pressing process may include a pre-setting step S110, an adjusting step S120, a loading step S130, and a pressing step S140. The pre-setting step S110 may set an initially-set load value of a pressing force, which will be exerted to the bottom stage 440 from each of the pressing members 1500, when the treatment substrate 100 is not provided. In the adjusting step S120, an adjusted load value to be exerted to the treatment substrate 100 may be set by increasing or decreasing the initially-set load value in consideration of the number and a size of the semiconductor chips 140 provided on the treatment substrate 100. In the loading step S130, the treatment substrate 140 may be loaded or laid on the bottom stage 440. Thereafter, the pressing step S140 may be performed. The pressing step S140 may include a fixedly-pressing step S142 and a variably-pressing step S144. The fixedly-pressing step S142 may be firstly performed to press the treatment substrate 100 with the pressing members 500 in such a way that a press exerted to the treatment substrate 100 reaches a specific fraction of the adjusted load value. Then, the variably-pressing step S144 may be secondly performed to press the treatment substrate 100 with the pressing members 500. During the variably-pressing step S144, the pressing force of the pressing members 500 may be adjusted based on the measured values from the load measuring device 1540, until such time the pressing force reaches the adjusted load value.

Figure 26:
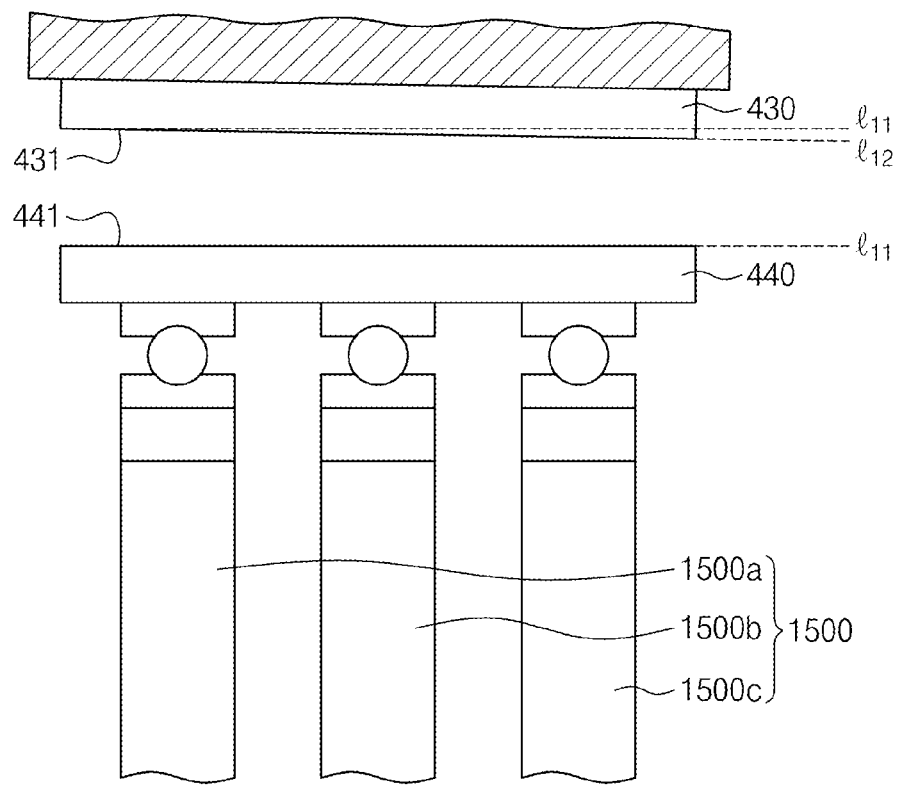
FIGS. 26, 27, 28, 29 and 30 are diagrams for sequential reference in the description of the pressing process associated with the flow chart shown in FIG. 25.
Figure 27:
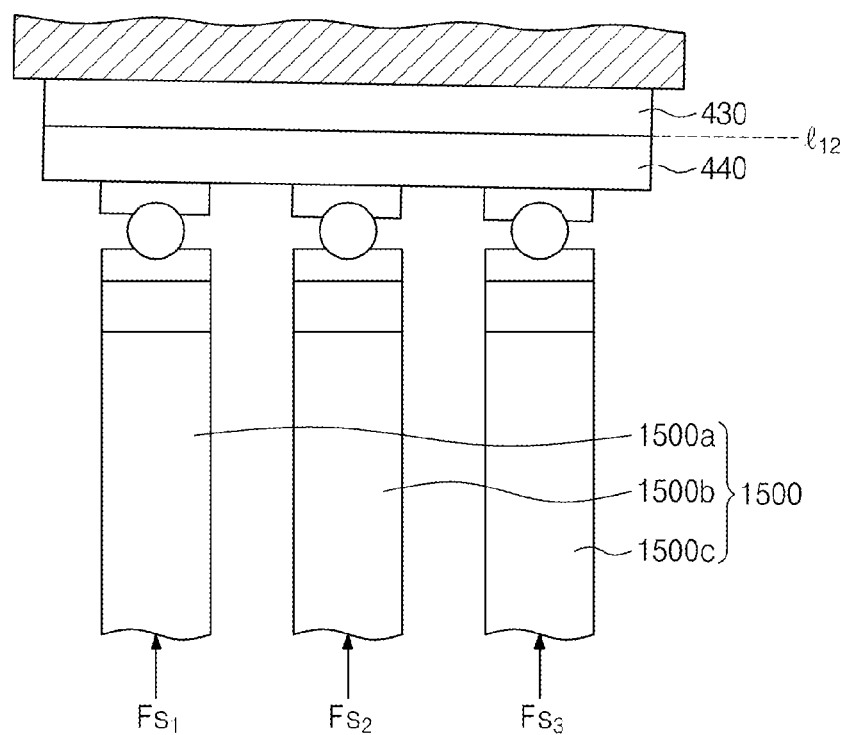
Figure 28:
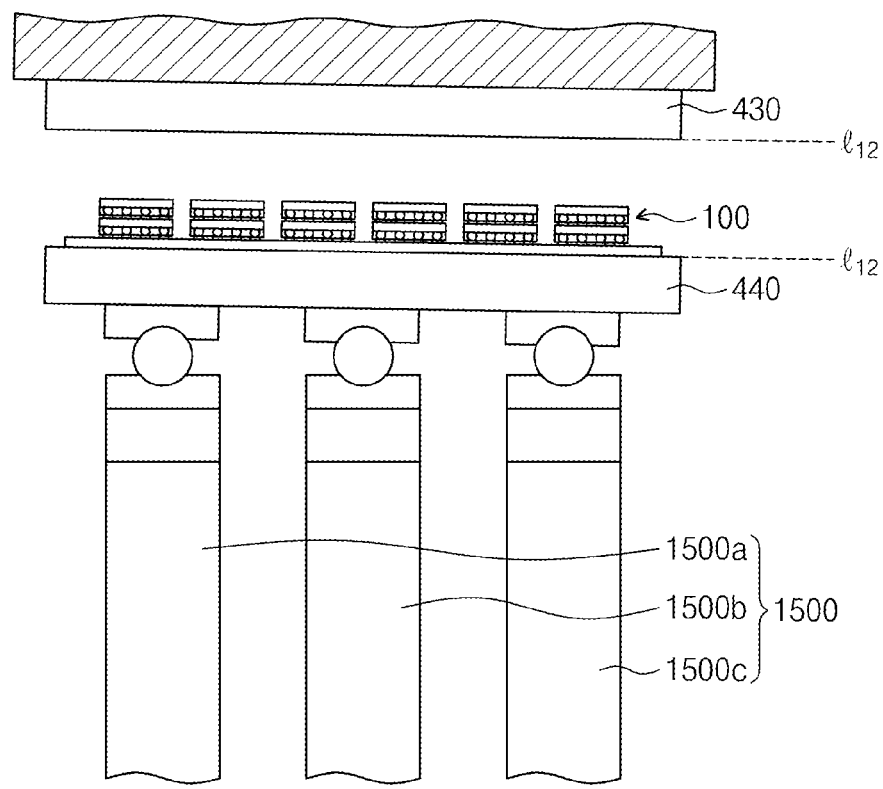
Figure 29:
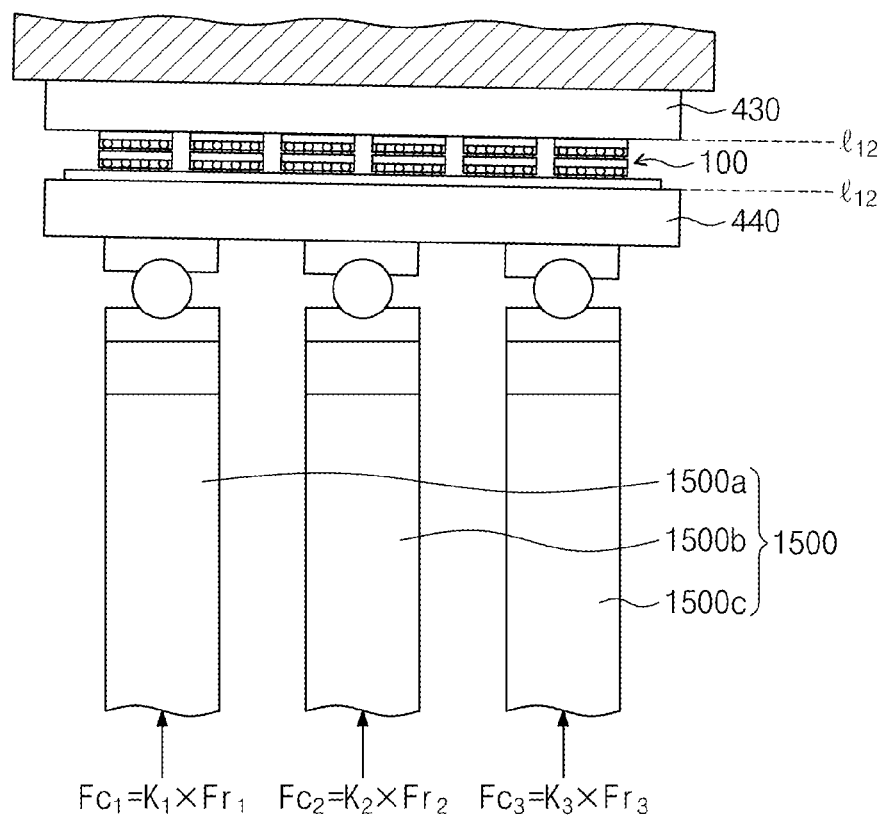
Figure 30:
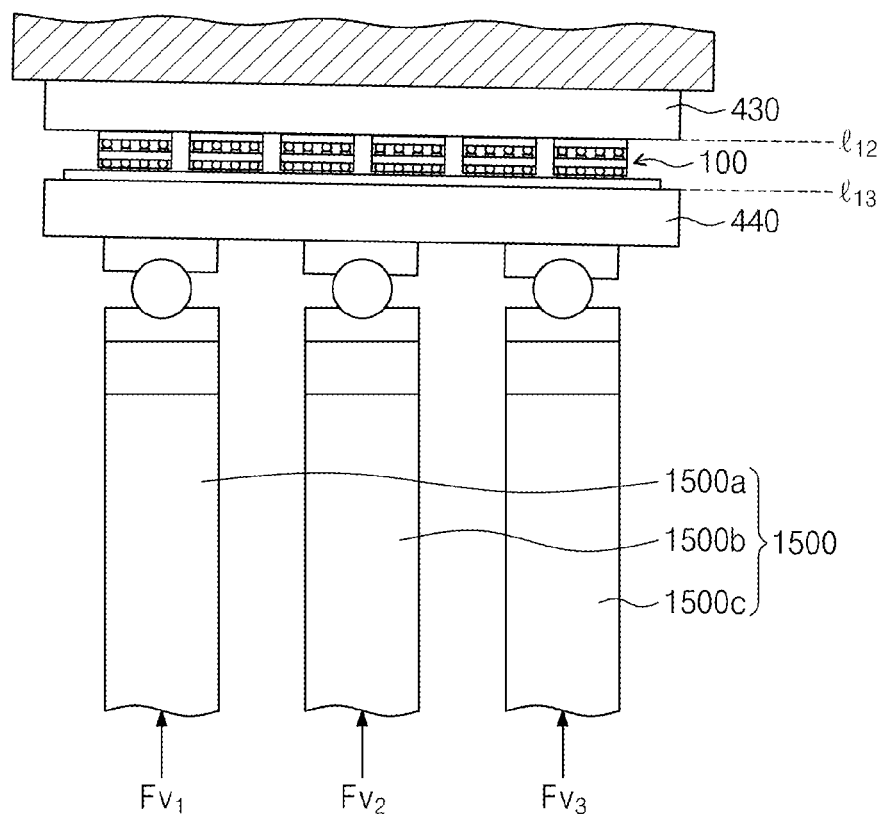

Hereinafter, the pre-setting step S110, the adjusting step S120, the loading step S130, and the pressing step S140 will be sequentially described with reference to FIGS. 26 through 30. FIGS. 26 and 27 illustrate sequentially the pre-setting step S110, FIG. 28 illustrates the loading step S130, and FIGS. 29 and 30 illustrate the fixedly-pressing step S142 and the variably-pressing step S144, respectively.

Referring to FIGS. 26 and 27, the pre-setting step S110 may be performed when the treatment substrate 100 is not provided on the bottom stage 440. Firstly, as shown in FIG. 26, the bottom stage 440 and the top stage 430 may be disposed to be spaced apart from each other. Here, a top surface 441 of the bottom stage 440 may be substantially parallel to a line $l_{11}$, and a bottom surface 431 of the top stage 430 may be substantially parallel to a line $l_{12}$. Here, the lines $l_{11}$ and $l_{12}$ may not be parallel to each other. Thereafter, as shown in FIG. 27, the bottom stage 440 may be elevated to be in contact with the top stage 430. The pressing members 1500 may independently adjust magnitudes of pressing forces exerted to the bottom stage 440, in such a way that a difference between values measured by the load measuring device 1540 is within a predetermined range. If the difference between values measured by the load measuring device 1540 is within a predetermined range, a top surface of the bottom stage 440 and a bottom surface of the top stage 430 may be substantially parallel to the line $l_{12}$. A pressing force exerted to the bottom stage 440 by each pressing member 1500 may be set as the initially-set load value. For example, when three pressing members 1500 are used, $Fs_1$, $Fs_2$, and $Fs_3$ may be set as the initially-set load values of first, second, and third pressing members 1500a, 1500b, and 1500c, respectively.

In the adjusting step S120, the adjusted load values may be set. The adjusted load values of the first, second, and third pressing members 1500a, 1500b, and 1500c may be defined as $Fr_1$, $Fr_2$, and $Fr_3$. A total load value Ft may be set in consideration of the size and number of the semiconductor chips 140 of the treatment substrate 100. Thereafter, the adjusted load values $Fr_1$, $Fr_2$, and $Fr_3$ of the first, second, and third pressing members 1500a, 1500b, and 1500c may be set in such a way that a sum of pressing forces to be exerted by the first, second, and third pressing members 1500a, 1500b, and 1500c becomes equivalent to the total load value Ft. The adjusted load values $Fr_1$, $Fr_2$, and $Fr_3$ of the first, second, and third pressing members 1500a, 1500b, and 1500c may be set by increasing or decreasing the initially-set load values $Fs_1$, $Fs_2$, and $Fs_3$ of the first, second, and third pressing members 1500a, 1500b, and 1500c based on a predetermined ratio. In certain examples, the adjusted load value $Fr_1$, $Fr_2$, and $Fr_3$ of the first, second, and third pressing members 1500a, 1500b, and 1500c may be set by increasing or decreasing the initially-set load values $Fs_1$, $Fs_2$, and $Fs_3$ of the first, second, and third pressing members 1500a, 1500b, and 1500c with the same ratio. Here, a relationship between the load values $Fr_1$, $Fr_2$, $Fr_3$ $Fs_1$, $Fs_2$, and $Fs_3$ may be given by the following formulae 1.

$$Fr_1 = k_1 \times Fs_1$$

$$Fr_2 = k_1 \times Fs_2$$

$$Fr_3 = k_1 \times Fs_3$$

$$Ft = Fr_1 + Fr_3 + Fr_3 \qquad \text{Formulae 1}$$

where $k_1$ is a real number greater than 0. Thereafter, the loading step S130 may be performed. In the loading step S130, as shown in FIG. 28, the treatment substrate 100 may be loaded onto the bottom stage 440.

In the pressing step S140, the treatment substrate 100 may be pressed between the bottom stage 440 and the top stage 430. For example, as shown in FIG. 29, the fixedly-pressing step S142 may be performed, and then, as shown in FIG. 30, the variably-pressing step may be performed.

In the fixedly-pressing step S142, regardless of the load values of the pressing members 1500 measured by the load measuring device 1540, each pressing member 1500 may apply a pressing force to the treatment substrate 100, until the pressing force reaches the predetermined initial load value. The initial load values of the first, second, and third pressing members 1500a, 1500b, and 1500c may be set to be smaller than the adjusted load values $Fr_1$, $Fr_2$, and $Fr_3$, respectively, of the first, second, and third pressing members 1500a, 1500b, and 1500c. In certain examples, the initial load values of the first, second, and third pressing members 1500a, 1500b, and 1500c may be set by decreasing the adjusted load values $Fr_1$, $Fr_2$, and $Fr_3$ of the first, second, and third pressing members 1500a, 1500b, and 1500c with a predetermined ratio. For example, if the initial load values of the first, second, and third pressing members 1500a, 1500b, and 1500c are given by $Fc_1$, $Fc_2$, and $Fc_3$, a relationship between the load values $Fc_1$, $Fc_2$, $Fc_3$, $Fr_1$, $Fr_2$, and $Fr_3$ may be given by the following formulae 2:

$$Fc_1 = k_2 \times Fr_1$$

$$Fc_2 = k_2 \times Fr_2$$

$$Fc_3 = k_2 \times Fr_3 \qquad \text{Formulae 2}$$

where $k_2$ is a real number between 0 and 1. In certain examples, $k_2$ may be a real number between 0.5 and 0.9. For example, $k_2$ may be 0.8. During the fixedly-pressing step S142, the top surface of the bottom stage 440 and the bottom surface of the top stage 430 may maintain substantially the parallel to the line $l_{12}$.

In the variably-pressing step S144, each pressing member 1500 may apply a pressing force to the treatment substrate 100, until the pressing force reaches final load values that are greater than the initial load values $Fc_1$, $Fc_2$, and $Fc_3$. Here, based on the pressing forces of the pressing members 1500 measured by the load measuring device 1540, the pressing forces exerted to the bottom stage 440 from the first, second, and third pressing members 1500a, 1500b, and 1500c may be independently controlled in such a way that the measured values are maintained to have the same value or a difference therebetween is maintained to be within a predetermined range. In the variably-pressing step S144, the pressing forces exerted to the bottom stage 440 from the first, second, and third pressing members 1500a, 1500b, and 1500c may be increased until a sum of the pressing forces becomes the same as the load value Ft or a difference therebetween becomes within a predetermined range, and then, such pressing forces may be maintained for a predetermined duration. In the variably-pressing step S144, the bottom surface of the top stage 430 may be maintained to be substantially parallel to the line $l_{12}$, and the top surface of the bottom stage 440 may become substantially parallel to the line $l_{13}$. Here, the lines $l_{12}$ and $l_{13}$ may not be parallel to each other.

According to example embodiments of the inventive concept, when the treatment substrate 100 is pressed, the pressing forces exerted to the treatment substrate 100 by the first, second, and third pressing members 1500a, 1500b, and 1500c may be independently controlled based on the values measured by the load measuring device 1540. Accordingly, the pressing forces may be uniformly exerted to the semiconductor chips 140 of the treatment substrate 100.

In the case where sufficiently-high pressing forces are not exerted to the semiconductor chips 140, the semiconductor chip 140 may be laterally moved during independently adjusting the pressing forces to be exerted to the semiconductor chips 140 based on the values measured by the load measuring device 1540, thereby causing a misalignment between the substrate 120 and the semiconductor chip 140 or between the semiconductor chips 140. In the present embodiments, the pressing step S140 may include the fixedly-pressing step S142 and the variably-pressing step S144 that are separately performed, and thus, it is possible to suppress the occurrence of this problem during the pressing step S140 of pressing the treatment substrate 100.

Figure 31:
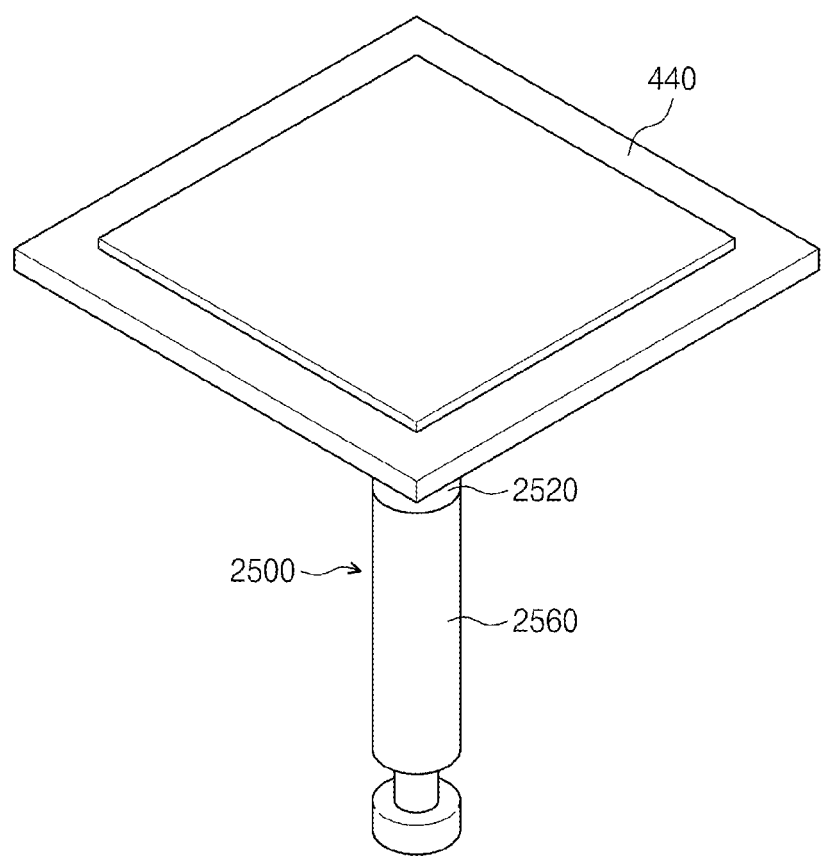
FIG. 31 is a perspective view illustrating other example of the pressing member shown in FIG. 11.

FIG. 31 is a perspective view illustrating another example of the pressing member of FIG. 11.

Referring to FIG. 31, in this example a single pressing member 2500 is connected to the bottom surface of the bottom stage 440. The pressing member 2500 may be disposed in such a way that a longitudinal direction thereof is positioned along a central axis of the bottom stage 440. The pressing member 2500 may include a joint 2520 and an actuator 2560. The joint 2520 may be joined to the bottom stage 440. The joint 2520 may be configured to control horizontal positioning of the bottom stage 440. The actuator 2560 may move vertically the joint 2520, and thus, the bottom stage 440 may press the top stage 430. The actuator 2560 may include a motor.

Figure 32:
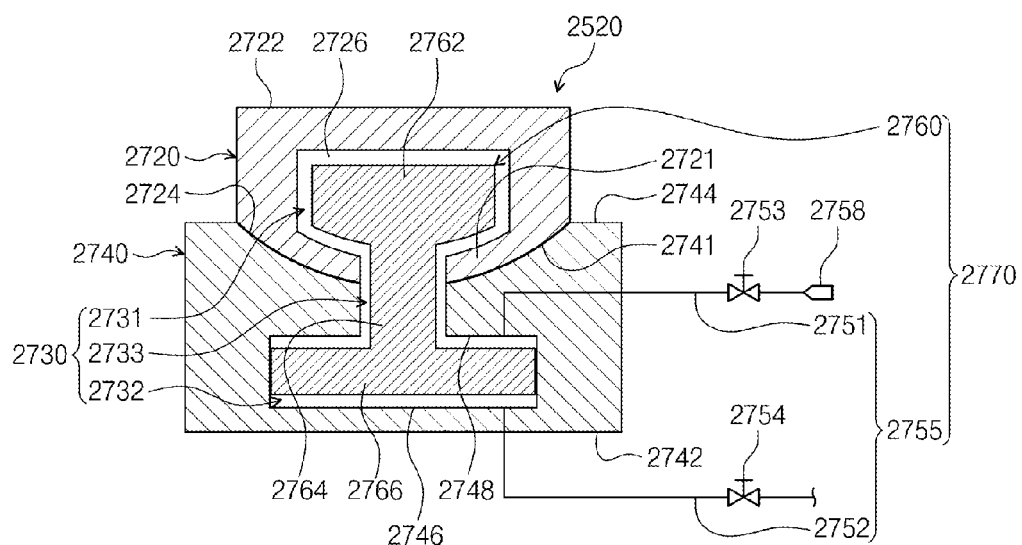
FIG. 32 is a sectional view schematically illustrating an example of a joint shown in FIG. 31.

FIG. 32 is a sectional view schematically illustrating an example of a joint of FIG. 31.

Referring to FIG. 32, the joint 2520 may include a rotating plate 2720, a fixed plate 2740, and a lock member 2770. The rotating plate 2720 and the fixed plate 2740 may be disposed vertically relative to one another and in contact with each other. The rotating plate 2720 may be fixedly joined to the bottom stage 440. The fixed plate 2740 may be joined to the actuator 2560. The fixed plate 2740 may include a bottom surface 2742 and a top surface 2744. The bottom surface 2742 of the fixed plate 2740 may be substantially flat. A concave portion 2741 may be formed on the top surface 2744 of the fixed plate 2740. The concave portion 2741 may be provided to have a curved section. The rotating plate 2720 may include a top surface 2722 and a bottom surface 2724. The top surface 2722 of the rotating plate 2720 may be substantially flat. A convex portion 2721 may be formed on the bottom surface 2724 of the rotating plate 2720. The convex portion 2721 may be provided to have a shape corresponding to the concave portion 2741 of the fixed plate 2740. The convex portion 2721 of the rotating plate 2720 may be inserted into the concave portion 2741 of the fixed plate 2740. The convex portion 2721 of the rotating plate 2720 may be configured to be rotated in the concave portion 2741 of the fixed plate 2740. As a variation of the above described configuration, the concave portion 2741 may be formed on the rotating plate 2720, and the convex portion 2721 may be formed on the fixed plate 2740.

The lock member 2770 may allow or limit rotation of the rotating plate 2720 with respect to the fixed plate 2740. In certain examples, the lock member 2770 may include an insert 2760 and a pressure controlling line 2755. The rotating plate 2720 and the fixed plate 2740 may be configured to provide an inner space 2730. The insert 2760 may be disposed in the inner space 2730. In certain examples, the inner space 2730 may include a first region 2731, a second region 2732, and a third region 2733. The first region 2731 may be formed in the rotating plate 2720. The second region 2732 may be formed in the fixed plate 2740. The third region 2733 may be formed to extend from the first region 2731 to the second region 2732, when the fixed plate 2740 and the rotating plate 2720 are in contact with each other. In top view, each of the first and second regions 2731 and 2732 may be provided to have an area larger than that of the third region 2733. In certain examples, the second region 2732 may be provided to be larger than the first region 2731 when viewed from the top (i.e., in a top view). As the result of the afore-described structure, there may be a height difference at interfacial regions between the first and third region 2731 and 2733 and between the second and third regions 2732 and 2733.

The insert 2760 may include a first portion 2762, a second portion 2764, and a third portion 2766. The first portion 2762 and the second portion 2764 may be disposed so as to be spaced apart from each other in the vertical direction. The third portion 2766 may extend from the first portion 2762 to the second portion 2764. In a top view, each of the first and second portions 2762 and 2764 may be provided to have an area which is larger than that of the third portion 2766. In certain examples, the second portion 2764 may be provided to have an area larger than that of the first portion 2762. As the result of the afore-described structure, there may be a height difference at interfacial regions between the first and third portions 2762 and 2766 and between the second and third portions 2764 and 2766. In a top view, the first portion 2762 may be provided to have an area that is smaller than that of the first region 2731 and is larger than that of the third region 2733. Further, in a top view, the second portion 2764 may be provided to have an area that is substantially equivalent to that of the second region 2732 and is larger than that of the third region 2733. In addition, in a top view, the third portion 2766 may be provided to have the area that is smaller than that of the third region 2733. A vertical length of the first portion 2762 may be smaller than that of the first region 2731, and a length of the second portion 2764 may be smaller than that of the second region 2732. The first 2762, the second portion 2764, and the third portion 2766 of the insert 2760 may be located at the first region 2731, the second region 2732, and the third region 2733, respectively, of the inner space 2730. As the result of the afore-described structure, the rotating plate 2720 may be rotated with respect to the fixed plate 2740 by a specific angle, when the insert 2760 is inserted into the inner space of the fixed plate 2740 and the rotating plate 2720.

The pressure controlling line 2755 may include an upper line 2751 and a lower line 2752. Each of the upper line 2751 and the lower line 2752 may be connected to the second region 2732 formed on the fixed plate 2740. The upper line 2751 may be connected to the second region 2732 at a level which is higher than the second portion 2764 of the insert 2760, and the lower line 2752 may be connected to the second region 2732 at a level which is lower than the second portion 2764 of the insert 2760. In certain examples, the upper line 2751 may be connected to a top surface 2748 of surfaces defining the second region 2732, and the lower line 2752 may be connected to a bottom surface 2746 of the surfaces defining the second region 2732. Valves 2753 and 2754 may be provided on the upper line 2751 and the lower line 2752, respectively. The valves 2753 and 2754 may be shut-off valves. At least one of the upper line 2751 and the lower line 2752 may be connected to a pressure controlling element 2758. In certain examples, the pressure controlling element 2758 may be a gas supply, and the upper line 2751 may be connected to the pressure controlling element 2758. If gas is supplied into the second region 2732 via the upper line 2751, the insert 2760 may descend in the inner space 2730, and a lower end portion of the first portion 2762 of the insert 2760 may press a bottom surface of the rotating plate 2720 defining the first region 2731. In this state, rotation of the rotating plate 2720 with respect to the fixed plate 1524 may be limited. Alternatively, a decompression member (not shown) may be connected to the lower line 2752, and a vacuum pressure may be applied to the lower line 2752, during supply the gas via the upper line 2751.

Figure 33:
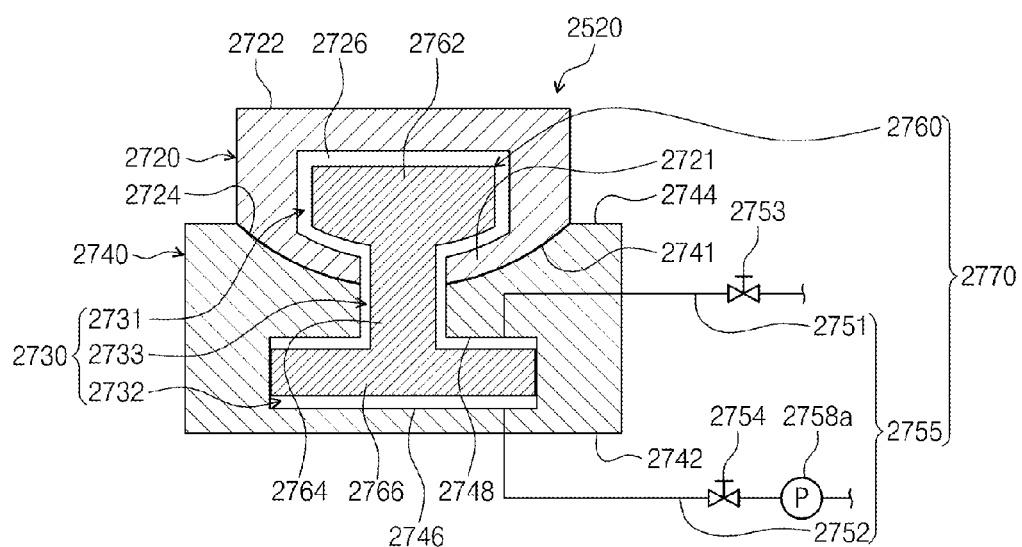
FIG. 33 is a sectional view schematically illustrating a modified example of the joint shown in FIG. 32.

Alternatively, as shown in FIG. 33, a pressure controlling element 2758a may be provided as the decompression member, and the lower line 2752 may be connected to the pressure controlling element 2758a. The decompression member may be a vacuum pump. If a vacuum pressure is exerted to the second region 2732 via the lower line 2752, the insert 2760 may descend in the inner space 2730, and the lower end portion of the first portion 2762 of the insert 2760 may press the bottom surface of the rotating plate 2720 defining the first region 2731. In this state, rotation of the rotating plate 2720 with respect to the fixed plate 1524 may be limited.

Figure 34:
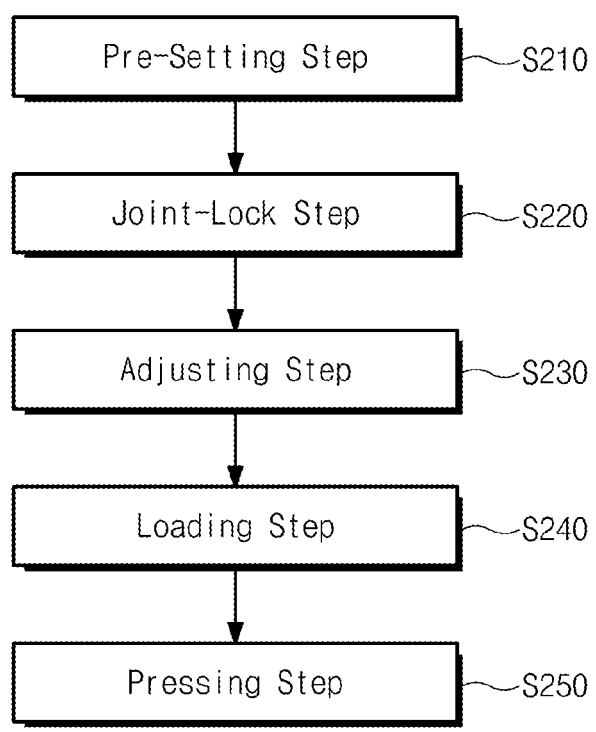
FIG. 34 is a flow chart for reference in describing an example of a pressing process, in which the pressing member shown in FIG. 31 is used to pressurize a treatment substrate.

FIG. 34 is a flow chart for reference in describing an example of a pressing process, in which the pressing member of FIG. 31 is used to pressurize a treatment substrate, and FIGS. 35 through 39 are diagrams sequentially illustrating an example of a pressing process, in which the pressing member of FIG. 31 is used to pressurize a treatment substrate.

Referring to FIG. 34, the pressing process may include a pre-setting step S210, a joint-lock step S220, an adjusting step S230, a loading step S240, and a pressing step S250. The pre-setting step S210 may be performed in such a way that the bottom stage 440 and the top stage 430 are parallel to each other, in the absence of the treatment substrate 100. The joint-lock step S220 may fix a horizontal position of the bottom stage 440, while maintaining parallelism between the bottom stage 440 and the top stage 430. In the adjusting step S230, a pressing force to be exerted to the treatment substrate 100 may be set in consideration of a number and size of the semiconductor chips 140 provided on the treatment substrate 100. In the loading step S240, the treatment substrate 100 may be loaded or laid onto the bottom stage 440. The pressing step S250 may exert a pressing force set in the adjusting step S230 to the treatment substrate, while fixing the horizontal position of the bottom stage 440.

Figure 35:
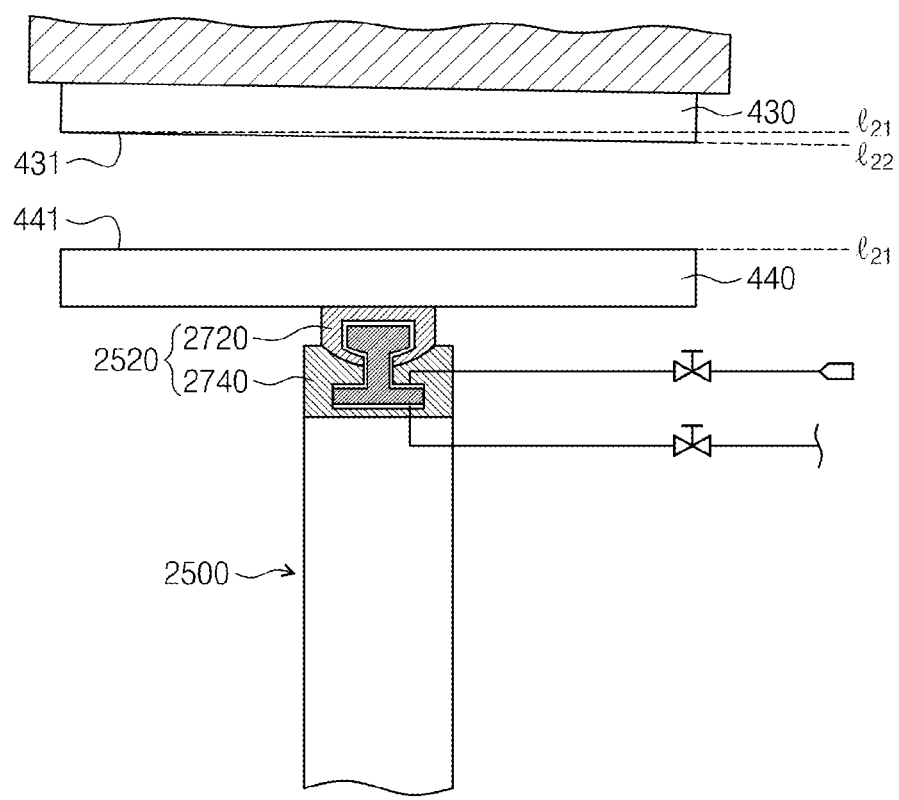
FIGS. 35, 36, 37, 38 and 39 are diagrams for sequential reference in the description of the pressing process associated with the flow chart shown in FIG. 34.
Figure 36:
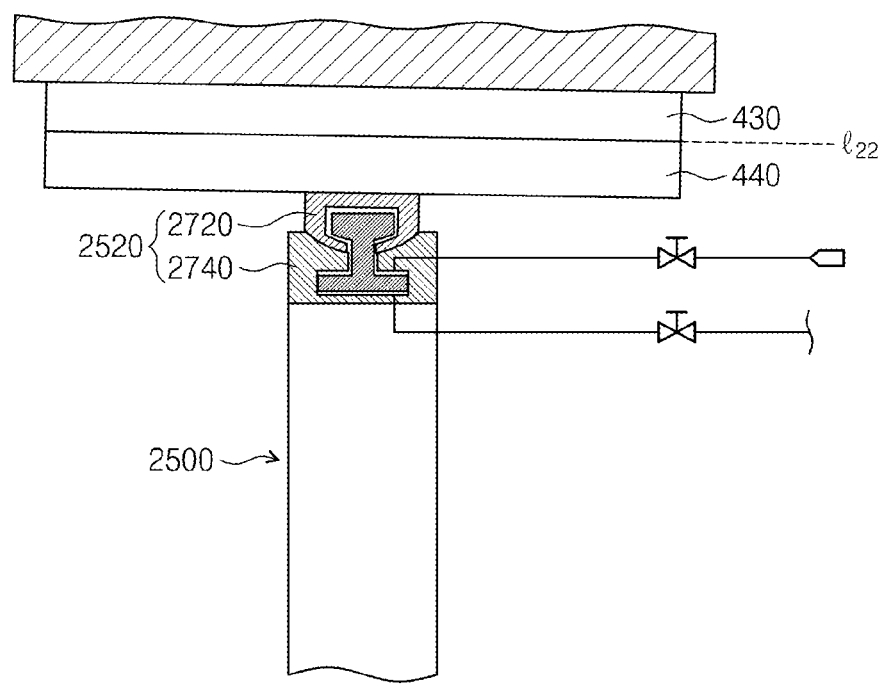
Figure 37:
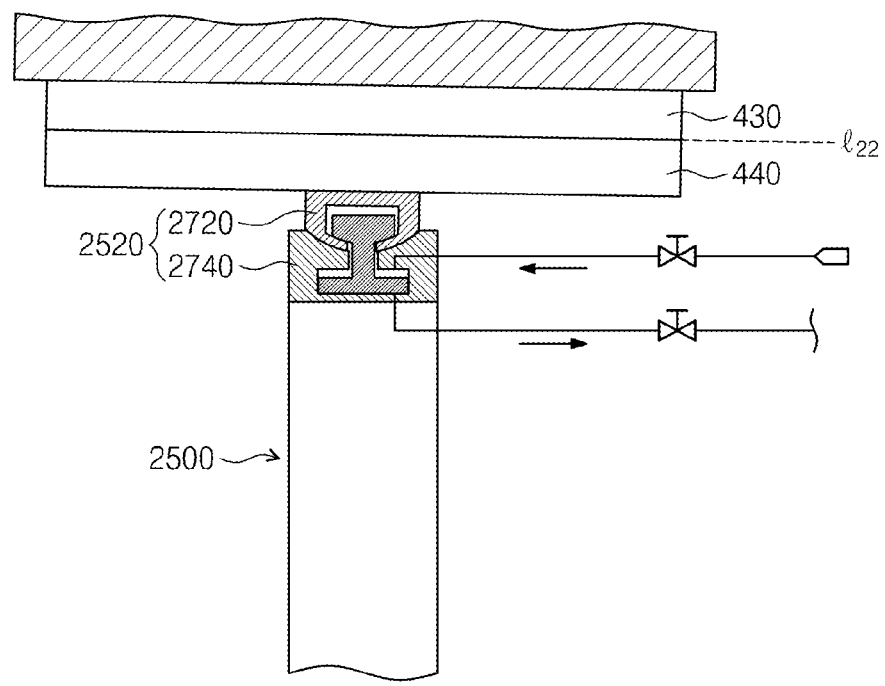
Figure 38:
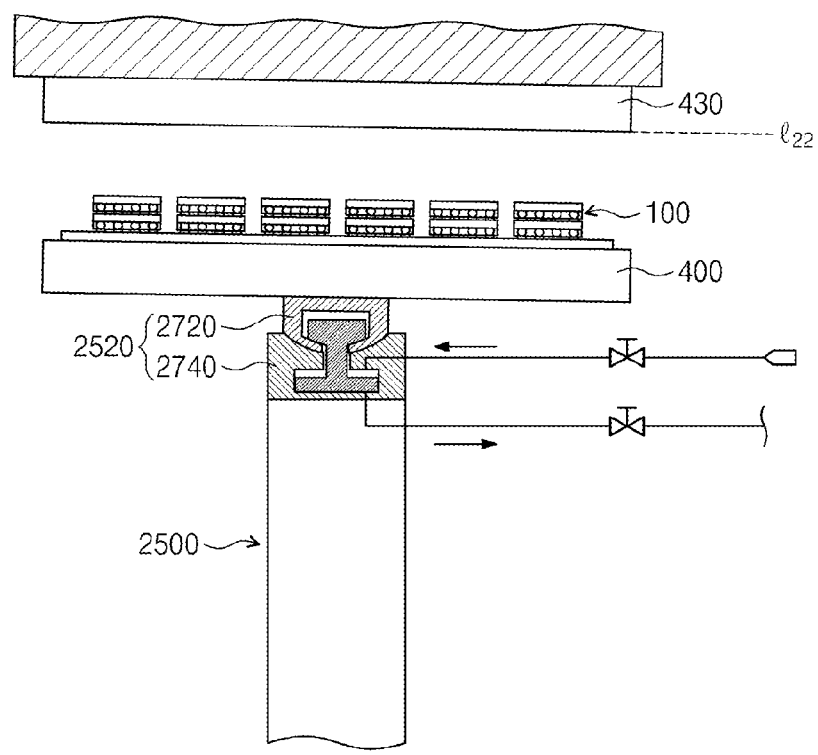
Figure 39:
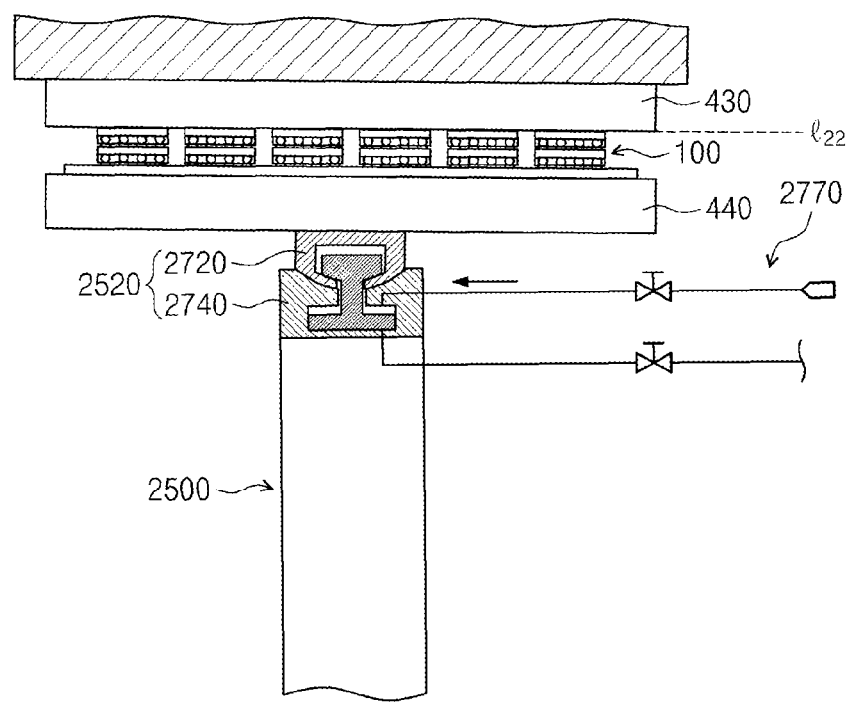

Hereinafter, the pre-setting step S210, the joint-lock step S220, the adjusting step S230, the loading step S240, and the pressing step S250 will be sequentially described with reference to FIGS. 35 through 39. FIGS. 35 and 36 illustrate an example of the pre-setting step S210, FIG. 37 illustrates an example of the joint-lock step S220, FIG. 38 illustrates an example of the loading step S240, and FIG. 39 illustrates an example of the pressing step S250.

Referring to FIGS. 35 and 36, the pre-setting step S210 may be performed when the treatment substrate 100 is not provided on the bottom stage 440. Firstly, as shown in FIG. 35, the bottom stage 440 and the top stage 430 may be disposed to be spaced apart from each other. Here, the top surface 441 of the bottom stage 440 may be substantially parallel to a line $l_{21}$, and the bottom surface 431 of the top stage 430 may be substantially parallel to a line $l_{22}$. Here, the lines $l_{21}$ and $l_{22}$ may not be parallel to each other. Thereafter, as shown in FIG. 36, the bottom stage 440 may be elevated to be in contact with the top stage 430. Here, the rotating plate 2720 may be provided to be rotatable with respect to the fixed plate 2740, and thereby, horizontal positioning of the rotating plate 2720 may be controlled in such a way that the top surface of the bottom stage 440 and the bottom surface of the top stage 430 are parallel to each other.

In the joint-lock step S220, the lock member 2770 may limit rotation of the rotating plate 2720 with respect to the fixed plate 2740, while maintaining the parallelism between the rotating plate 2720 and the fixed plate 2740.

In the adjusting step S230, a pressing force of the pressing member may be set. The pressing force may be set in consideration of a size and number of semiconductor chips 140 provided on the treatment substrate 100.

Thereafter, in the loading step S240, as shown in FIG. 38, the treatment substrate 100 may be loaded or laid on the bottom stage 440.

In the pressing step S250, the treatment substrate 100 may be pressed with the bottom stage 440 and the top stage 430. The pressing member 2500 may exert a pressing force set in the adjusting step S230 onto the treatment substrate 100. During the pressing step S250, the lock member 2770 may continue to limit the rotation of the rotating plate 2720 with respect to the fixed plate 2740.

According to the present embodiments, the horizontal positioning of the bottom stage 440 may be initially controlled in such a way that the bottom stage 440 and the top stage 430 are parallel to each other, and then, the horizontal positioning of the bottom stage 440 may be fixed. Thereafter, in the pressing step S250, the pressing of the treatment substrate 100 may be performed with the fixed horizontal positioning of the rotating plate 2720, and thus, the treatment substrate 100 may be continuously pressed while parallelism between the top stage 430 and the bottom stage 440 is being maintained.

Figure 40:
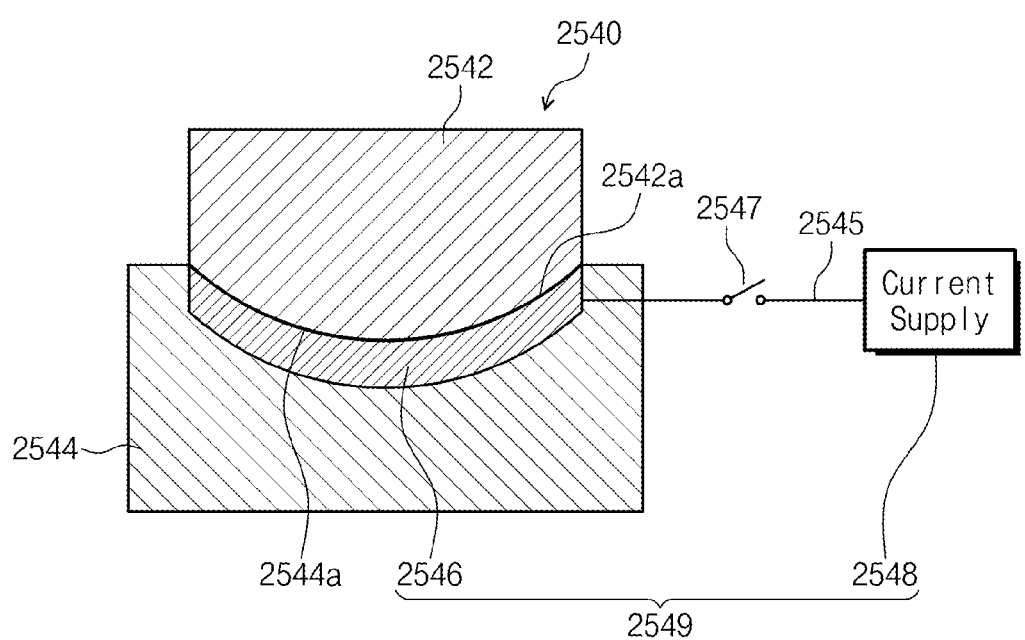
FIG. 40 is a sectional view schematically illustrating another example of the joint shown in FIG. 31.

FIG. 40 is a sectional view schematically illustrating other example of the joint of FIG. 31. Referring to FIG. 40, a joint 2540 may include a rotating plate 2542, a fixed plate 2544, and a lock member 2549. The rotating plate 2542 and the fixed plate 2544 may have the same or similar structures as the rotating plate 2720 and the fixed plate 2740 of FIG. 32. The lock member 2549 may include an electromagnet 2546 and a current supplying device 2548. The electromagnet 2546 may be provided between the fixed plate 2544 and the rotating plate 2542. Alternatively, the electromagnet 2546 may be disposed in the fixed plate 2544 and adjacent to a concave portion 2544a. The electromagnet 2546 may have the same curvature as the concave portion 2544a. The rotating plate 2542 may be formed of a metallic material. The current supplying device 2548 may supply electric current to the electromagnet 2546 via a conductive wire 2545. A switch 2547 may be provided on the conductive wire 2545. If the switch 2547 is in an off-state, the rotating plate 2720 may rotate with respect to the fixed plate 2544. If the switch 2547 is in an on-state, the rotating plate 2720 may be fixed to the fixed plate 1524 by a magnetic force and, thus, the rotation of the rotating plate 2720 with respect to the fixed plate 1524 may be limited. Alternatively, the rotating plate 2720 may be formed of a metallic material, and the electromagnet 2546 may be provided in a convex portion 2542a of the fixed plate 1524.

According to the afore-described embodiments, the top stage is fixed while the bottom stage is moveable in a vertical direction. However, the inventive concepts include configurations in which the bottom stage is fixed and the top stage moved vertically, and configurations in which both the bottom stage and top stage are moved.

Figure 41:
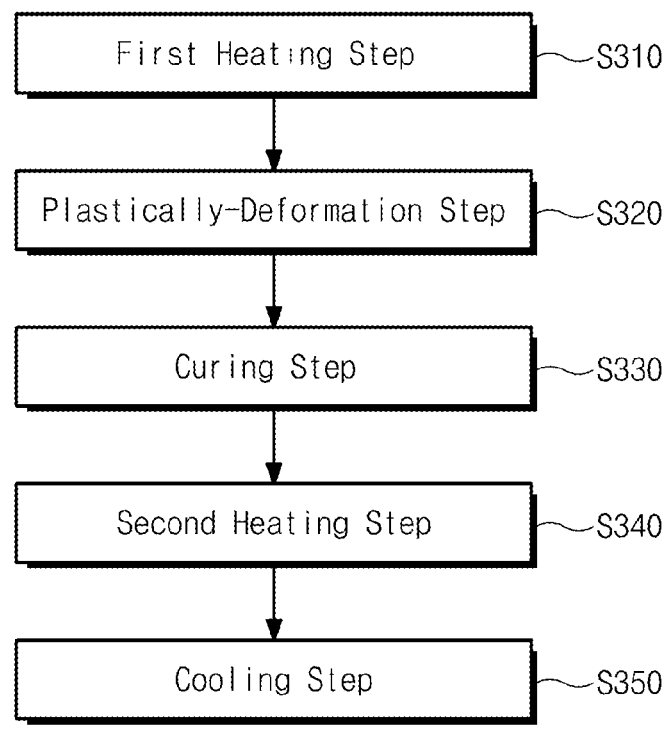
FIG. 41 is a flow chart for reference in describing a bonding process according to example embodiments of the inventive concept.

Hereinafter, a bonding process according to embodiment of the inventive concept will be described with reference to FIGS. 41 through 47. FIG. 41 is a flow chart sequentially illustrating a bonding process according to example embodiments of the inventive concept.

FIGS. 42 through 47 are diagrams for reference in describing states of an NCF and a solder, in each of the process steps of FIG. 41. As explained previously in connection with FIG. 1, a joint member may be provided on bottom surfaces of semiconductor chips which partially encases electrical connection members of the semiconductor chips. In the examples presented in FIGS. 42 through 47, the joint member is an NCF shown by reference number 146, and the electrical connection members are solder bump or balls shown by reference number 142. Also in the examples of FIGS. 42 through 47, a first semiconductor chip 140b is bonded to electrical connection members 122 (e.g. pads) of an underling substrate (e.g., wafer or PCB), and a second semiconductor chip 140a is bonded to electrical connections members 144 (e.g., pads) of the underlying first semiconductor chip 140b. The first and second semiconductor chips 140b and 140a constitute a chip stack 140. Reference number 430 of these same figures represents a top stage 430 having a heating element 462, and reference number 440 of these figures denotes a bottom stage having a heating element 464.

Referring to FIG. 41, the bonding process of this embodiment includes a first heating step S310, a plastic-deformation step S320, a curing step S330, a second heating step S340, and a cooling step S350. It should be noted, however, that some of these steps may overlap one another a timewise manner. Also, the bonding process is described as being carried out in a bonding apparatus such as those described previously herein, but embodiments of the inventive concept may be carried out in other bonding apparatus as well.

Briefly, after the treatment substrate 100 is loaded into a bonding apparatus, a first heating step S310 is carried out in which the treatment substrate 100 is heated to a temperature sufficient to melt or substantially melt the NCF 146, but not the solder 142. In the plastic-deformation step S320, the solder 142 of the semiconductor chips 140 is plastically deformed by application of pressure. In the curing step S330, the NCF 146 surrounding the deformed solder is cured to a solid or substantially solid state. In the second heating step S310, treatment substrate 100 is heated to a temperature sufficient to melt or substantially melt the solder 142 to bond with the underlying pad 144 or 122. In the cooling step S350, the solder 142 joined to the pad 122 and 144 may be quenched into a solid state.

Figure 42:
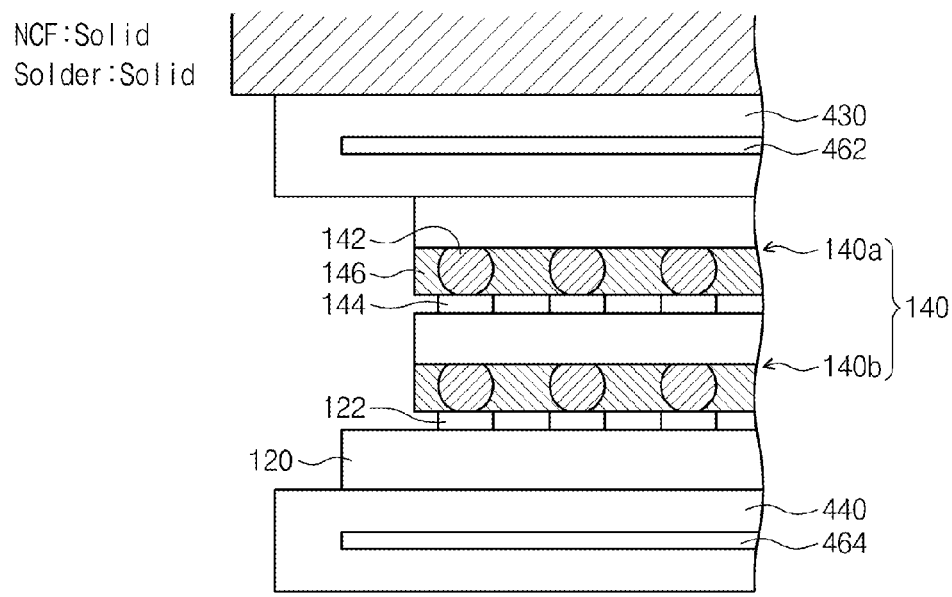
FIGS. 42, 43, 44, 45, 46 and 47 are diagrams for sequential reference in the description of the bonding process associated with the flow chart shown in FIG. 41.

FIG. 42 illustrates the bottom stage 440 loaded with the treatment substrate 100, and FIGS. 43 through 47 are representative of the first heating step S310, the plastic-deformation step S320, the curing step S330, the second heating step S340, and the cooling step S350, respectively. In FIGS. 42 through 46, the solder 142 and the NCF 146 filled with oblique lines indicates that they are in a solid or substantially solid state, and the solder 142 and the NCF 146 filled with dots indicates that they are in a liquid state or substantially liquid state. In the drawings, Tt and Tb denote temperatures of the top heater 462 and the bottom heater 464, and P denotes a pressing force to be exerted on the treatment substrate 100.

Hereinafter, each step of the bonding process will be described with reference to FIGS. 42 through 47. For simplicity, the description that follows will refer to an example of the present embodiment in which the treatment substrate is the treatment substrate 100 of FIG. 1 and the bonding process is performed using the bonding unit 401 of FIG. 8. However, as already stated, the inventive concept is not limited in this manner.

As shown in FIG. 42, the bottom stage 440 may be elevated after the treatment substrate 100 is loaded on the bottom stage 440. In this initial state, the NCF 146 and the solder 142 of the upper chip 140a and the lower chip 140b are in a solid state.

Figure 43:
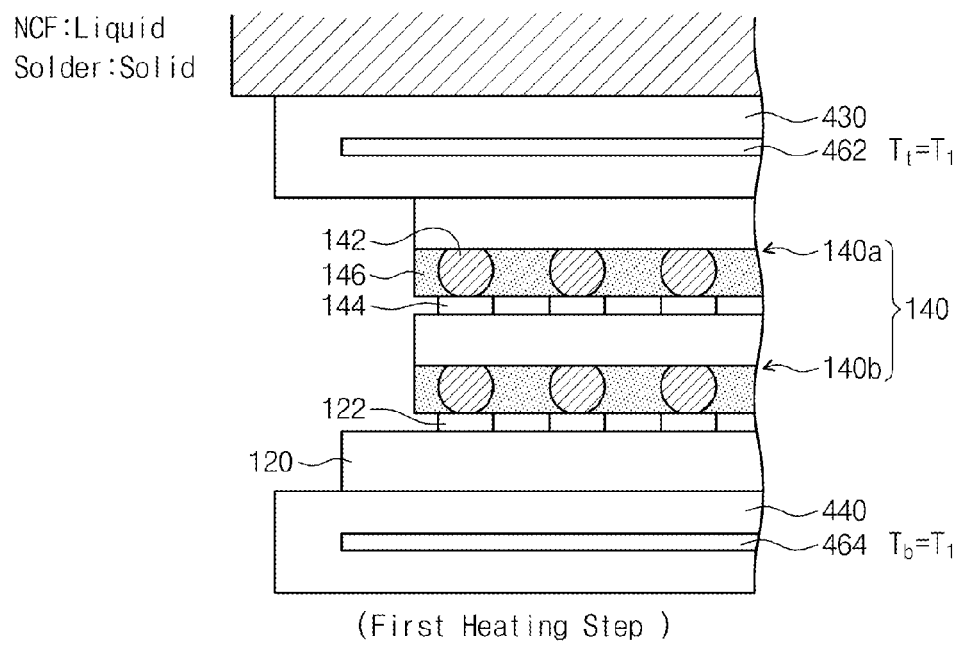

Thereafter, the first heating step S310 is performed. Referring to FIG. 43, one or both of the top and bottom heating elements 462 and 464 heat the treatment substrate 100 to a first temperature T1 that is higher than a melting point of the NCF 146 and lower than a melting point of the solder 142. As one non-limiting example, the first temperature T1 may be about 120 degrees Celsius. The NCF 146 of the upper and lower chips 140a and 140b assumes a liquid state or substantially liquid state, while the solder 142 of the upper and lower chips 140a and 140b remain in a solid or substantially solid state.

Figure 44:
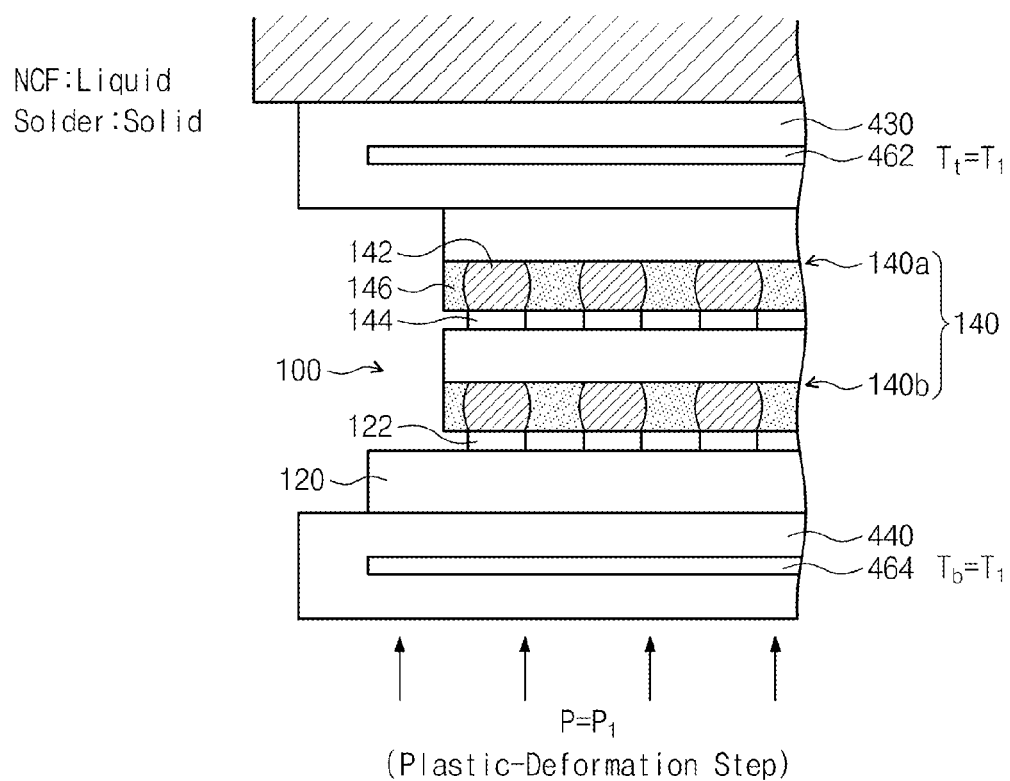

Next, the plastic-deformation step S320 is performed. Referring to FIG. 44, during the liquid state of the NCF 146, the treatment substrate 100 may be pressurized between the bottom stage 440 and the top stage 430 at a first pressure P1. During this time, the top and bottom heating elements 462 and 464 maintains the treatment substrate 100 at the first temperature T1. The first pressure P1 is sufficient to plastically deform the solder 142 of the upper chip 140a and the lower chip 140b. In addition, a strong deformation contact may be established between the solder 142 and the underlying pads 144 and 122, thereby inhibiting lateral slippage in later steps of the bonding process. Here, deformation contact means physical contact rather than actually bonding.

Figure 45:
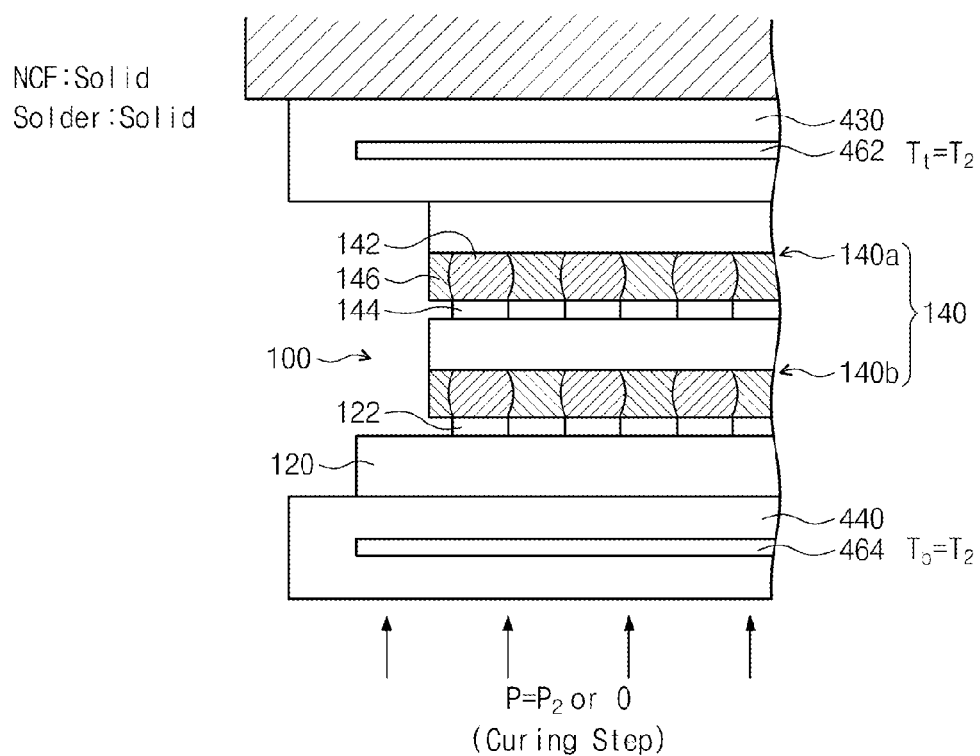

Next, the curing step S330 is performed. Referring to FIG. 45, the top and bottom heating elements 462 and 464 may heat the treatment substrate 100 to a second temperature T2 during a predetermined curing time Ts. The curing time Ts may be dependent upon the second temperature T2, and in certain embodiments, the curing time Ts is inversely proportional to the second temperature T2. In any case, the second temperature T2 and curing time Ts may be selected to maximize throughput, while at the same time avoiding melting of the solder 142. In certain examples, the curing time Ts may be set from one minute to twenty minutes.

The second temperature T2 should be low enough to avoid melting of the solder 142, and, for example, the second temperature T2 may be the same as the first temperature T1. In the case where T1=T2, the first heating step S310 and the curing step S330 may be considered as a single continuous step. Prior to curing, the NCF 146 may be characterized by being initially melted at the first temperature T1, and by being cured or polymerized by continued application of the first temperature T1 (or the second temperature T2). Once cured, the melting temperature of the NCF 146 is substantially increased relative to its uncured initial state. For this reason, the cured NCF 146 is not melted in a second heating step S334 described below.

It is noted that during the curing step S330, the treatment substrate 100 may be pressurized between the upper and lower stages 430 and 440 to a second pressure P2. Such pressure can increase a polymerization energy, which in turn can make it possible to reduce a process time taken for curing the NCF 146. Alternatively, the curing step S330 may be performed without pressurizing the treatment substrate 100. Also, the second pressure P2, if applied, may be the same as or different from the first pressure P1.

Figure 46:
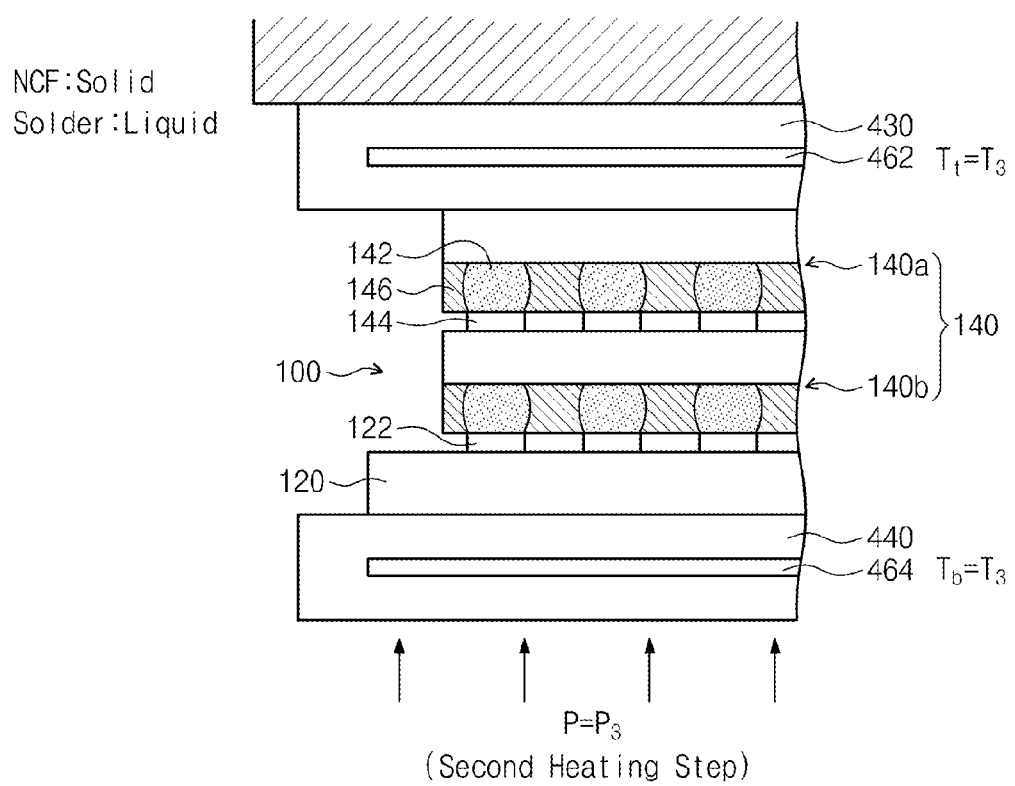
Figure 47:
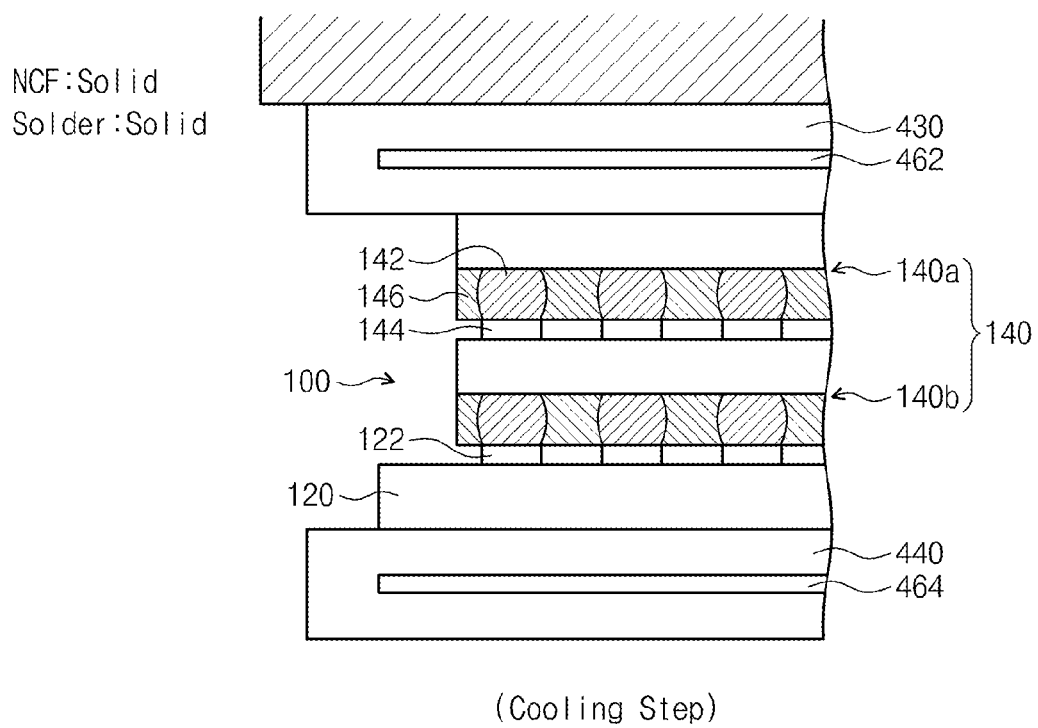

Once curing of the NCF 146 is complete, the second heating step S340 is performed. Referring to FIG. 46, the top and bottom heating elements 462 and 464 heat the treatment substrate 100 to a third temperature T3 which is higher than the melting point of the solder 142. For example, the third temperature T3 may be about 270 degrees Celsius. On the other hand, as mentioned above, the cured NCF 146 is maintained in a solid state during melting of the solder 142 at the third temperature T3.

Also, during the second heating step S340, the treatment substrate may be pressurized between the upper and lower stages 430 and 440 to a third pressure P3. The third pressure P3 may, for example, be the same as or higher than the first pressure P1. The third pressure P3 may act in combination with the third temperature T3 to achieve a melted state of the solder 142. At this time, the solder 142 of the upper chip 140a may be bonded with the pad 144 of the lower chip 140b, and the solder 142 of the lower chip 140b may be bonded with the pad 122 of the substrate 120.

If, in contrast to the present embodiment, the NCF 146 and the solder 142 are both heated to a liquid state at the same time, misalignment may occur between the upper chip 120a and the lower chip 120b and/or between the substrate 120 and the lower chip 120b when the treatment substrate 100 is pressurized between the upper and lower stages 430 and 440. By deforming the solder 142 and curing the NCF 146 before melting of the solder 142 as in the present embodiment, the accuracy of alignment between the upper and lower chips 120a and 120b and/or between the substrate 120 and the lower chip 120b may be enhanced.

Next, the cooling step S350 is performed which may include quenching (forced cooling) of the treatment substrate 100. As the result, the solder 142 becomes the solid state, and bonding between the solder 142 of the upper chip 140a and the pad 144 of the lower chip 140b and between the solder 142 of the lower chip 140b and the pad 122 of the substrate 120 may be complete. The cooling may be performed using a cooling member (not shown) provided in the top stage 430 and/or the bottom stage 440.

It is noted that it may be possible to enhance throughput by carrying out the first and second heating steps S310 and S340 in different chambers. This is because time may be saved by avoiding the need to await transition of a chamber temperature from the temperatures T1 to T3, for example.

Figure 48:
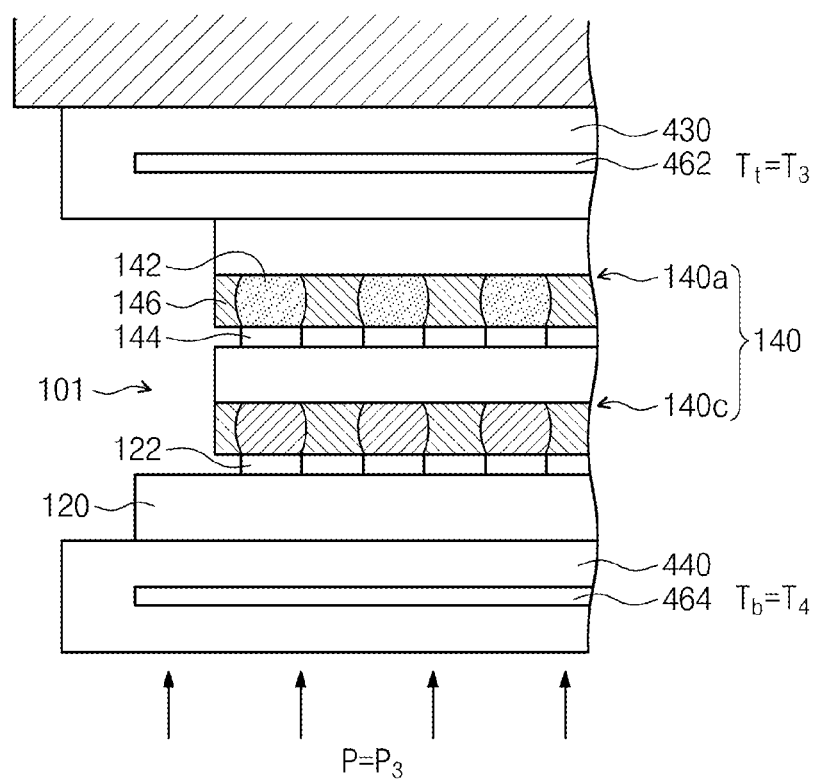
FIG. 48 is a diagram for reference in describing another example of a second heating step of the bonding process associated with the flow chart shown in FIG. 41.

FIG. 48 is for reference in describing an example of the second heating step S340 in a case where the treatment substrate 101 of FIG. 2 is processed. As described with reference to FIG. 2, the treatment substrate 101, in which the solder 142 of the lower chip 140b is already bonded to the pad 122 of the substrate 120, may be loaded into a bonding apparatus. Here, the bonding apparatus is used to bond the solder 142 of the upper chip 140a to the pad 144 of the lower chip 140b. The bonding apparatus may be configured, as described above, to perform the first heating step S310, the plastic-deformation step S320, the curing step S330, the second heating step S340, and the cooling step S350 on the treatment substrate 101. The first heating step S310, the plastic-deformation step S320, the curing step S330, and the cooling step S350 may be performed in the same manner as described with reference to FIGS. 43 through 45 and 47.

In the heating melting step S340 associated with FIG. 48, the top and bottom heating elements 462 and 464 may exert respectively different temperatures to the treatment substrate 101. For example, the top heating element 462 may apply heat at a third temperature T3 and the bottom heating element 464 may apply heat at a fourth temperature T4. Here, in the example of FIG. 48, the third temperature T3 is higher than the fourth temperature T4 and higher than a melting point of the solder 142, as described above. The fourth temperature T4, on the other hand, may be lower than the melting point of the solder 142. For example, the fourth temperature T4 may be the same as the afore-described first temperature T1. Accordingly, the solder 142 of the upper chip 140a may be changed into a liquid state, while the solder 142 of the lower chip 140b remain a solid state. Alternatively, the treatment substrate 101 may be heated solely by the top heating element 462, and not by the bottom heating element 464.

Figure 49:
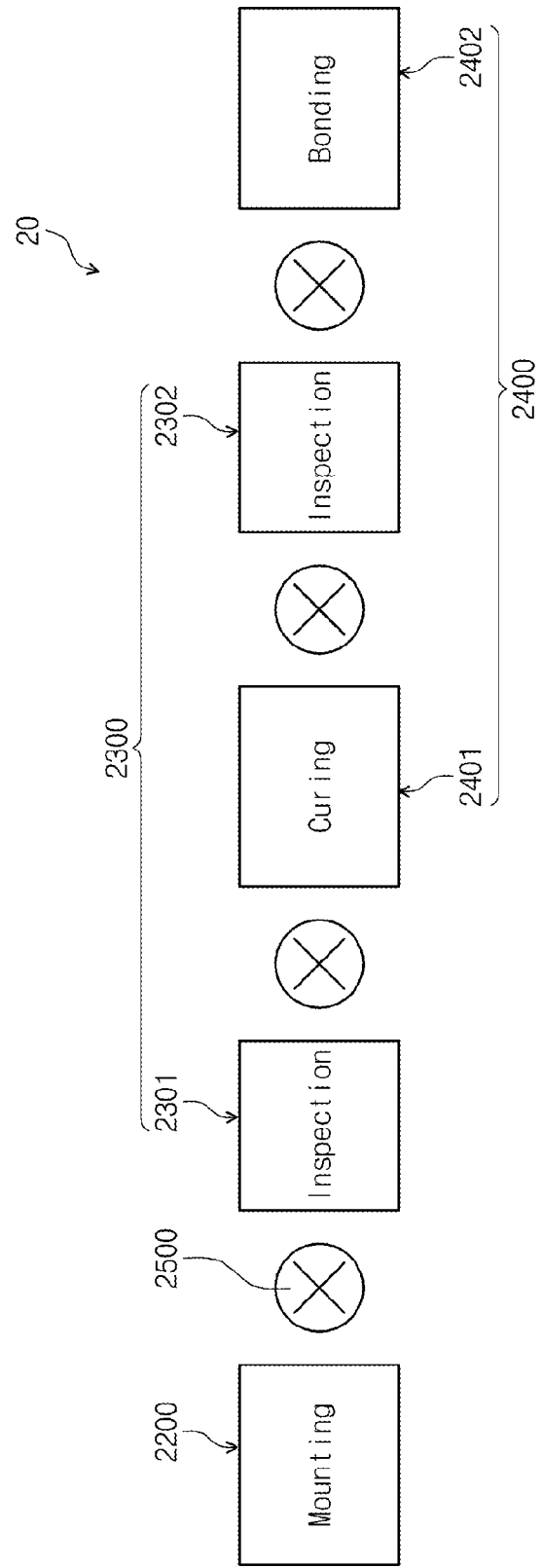
FIGS. 49, 50 and 51 are schematic diagrams illustrating other respective examples of the substrate-manufacturing system shown FIG. 5.

FIG. 49 is a schematic diagram illustrating other example of the substrate-manufacturing system of FIG. 5.

Referring to FIG. 49, a substrate-manufacturing system 20 of this example includes a mounting apparatus 2200, an inspection apparatus 2300, and a bonding apparatus 2400. The inspection apparatus 2300 may include a mounting inspection unit 2301 and a curing inspection unit 2302. The bonding apparatus 2400 may include a curing unit 2401 and a bonding unit 2402. The mounting apparatus 2200, the mounting inspection unit 2301, and the curing inspection unit 2302 may be configured to have substantially the same or similar features as the mounting apparatus 200, the mounting inspection unit 301, the bonding inspection unit 302, respectively, of FIG. 5. The mounting apparatus 2200, the mounting inspection unit 2301, curing unit 2401, the curing inspection unit 2302, and the bonding unit 2402 may be sequentially disposed. A carrier unit 2500 may be provided between the each of adjacent apparatuses or the units. The curing unit 2401 and the bonding unit 2402 may be configured to have the same structure as the unit 401 of FIG. 8.

In the example of FIG. 49, the curing unit 2401 may be configured to perform the first heating step S310, the plastic-deformation step S320, and the curing step S330 of FIG. 41. The bonding unit 2402 may be configured to perform the second heating step S340 and the cooling step S350 of FIG. 41. The curing inspection unit 2302 may be configured to examine whether a semiconductor chip 140 is properly aligned with an underlying semiconductor chip 140 or substrate 120 after the curing step S330 is complete.

Figure 50:
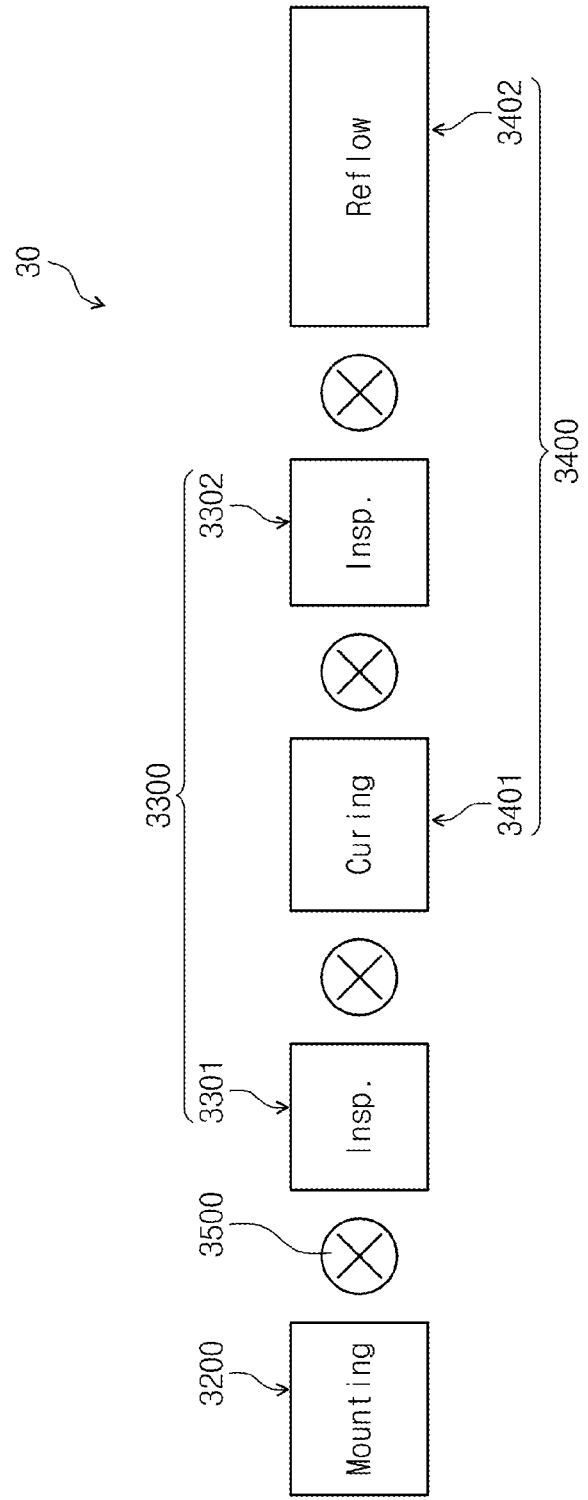

FIG. 50 is a schematic diagram illustrating still another example of the substrate-manufacturing system of FIG. 5. The substrate-manufacturing system 30 of this example may be configured to perform a bonding process to the treatment substrate 101 of FIG. 2. As described with reference to FIG. 2, the treatment substrate 101, in which the solder 142 of the lower chip 140b is already bonded to the pad 122 of the substrate 120, may be loaded into a bonding apparatus. Here, the bonding apparatus is used to bond the solder 142 of the upper chip 140a to the pad 144 of the lower chip 140b.

Referring to FIG. 50, the substrate-manufacturing system 30 of this example includes a mounting apparatus 3200, an inspection apparatus 3300, and a bonding apparatus 3400. The inspection apparatus 3300 may include a mounting inspection unit 3301 and a curing inspection unit 3302. The bonding apparatus 3400 may include a curing unit 3401 and a reflow unit 3402. The mounting apparatus 3200, the mounting inspection unit 3301, the curing unit 3401, and the curing inspection unit 3302 may be configured to have substantially the same or similar features as the mounting apparatus 2200, the mounting inspection unit 2301, the curing unit 2401, and the curing inspection unit 2302, respectively, of FIG. 49. The mounting apparatus 3200, the mounting inspection unit 3301, the curing unit 3401, the curing inspection unit 3302, and the reflow unit 3402 may be sequentially disposed. A carrier unit 3500 may be provided between each of adjacent apparatuses or units.

The curing unit 3401 may be configured to perform the first heating step S310, the plastic-deformation step S320, and the curing step S330 of FIG. 41. The reflow unit 3402 may be configured to perform the second heating step S340 of FIG. 41 in the same manner as described above in connection with FIG. 48. In addition, the second heating step S340 may be performed using a reflow process to melt the solder 142 by heating the treatment substrate 101 without pressurizing the treatment substrate 101. The cooling step S350 may be performed by natural cooling or by forced cooling. The curing inspection unit 3302 may be configured to examine whether the semiconductor chips 140 are properly aligned with each other after the curing step S330 and before the second heating step S340. A carrier unit 3500 may be provided between the curing inspection unit 3302 and the reflow unit 3402 to transport the treatment substrate 101, which has been examined using the curing inspection unit 3302, directly to the reflow unit 3402. Alternatively, the treatment substrate 101 after curing may be transferred to a container for storage until the second heating step S340 and cooling step S350 are carried out at a later time. An example of such a container is described later with reference to FIG. 52. The container containing the cured treatment substrate(s) may be moved to the reflow unit 3402 by an operator or a carrier mechanism (not shown).

Figure 51:
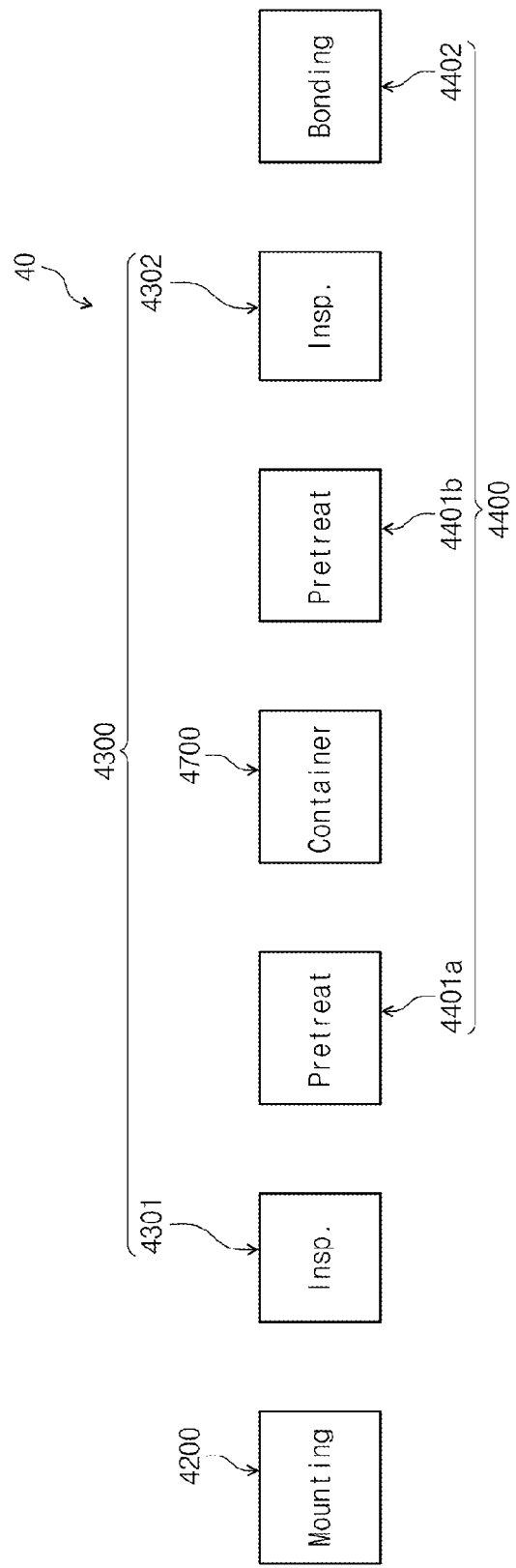

FIG. 51 is a schematic diagram illustrating yet another example of the substrate-manufacturing system of FIG. 5.

Referring to FIG. 51, a substrate-manufacturing system 40 of this example includes a mounting apparatus 4200, an inspection apparatus 4300, a container 4700, and a bonding apparatus 4400. The inspection apparatus 4300 may include a mounting inspection unit 4301 and a post-treatment inspection unit 4302. The bonding apparatus 4400 may include a pre-treatment unit 4401a, a post-treatment unit 4401b, and a bonding unit 4402. The mounting apparatus 4200, the mounting inspection unit 4301, the post-treatment inspection unit 4302, and the bonding unit 4402 may be configured to have substantially the same or similar features as the mounting apparatus 2200, the mounting inspection unit 2301, the curing inspection unit 2302, and the bonding unit 2402, respectively, of FIG. 49. Each of the pre-treatment unit 4401a and the post-treatment unit 4401b may be configured to have substantially the same or similar structure as the bonding unit 401 of FIG. 8.

The pre-treatment unit 4401a may be configured to perform the first heating step S310 and the plastic-deformation step S320 of FIG. 41, and the post-treatment unit 4401b may be configured to perform the curing step S330 of FIG. 41.

Figure 52:
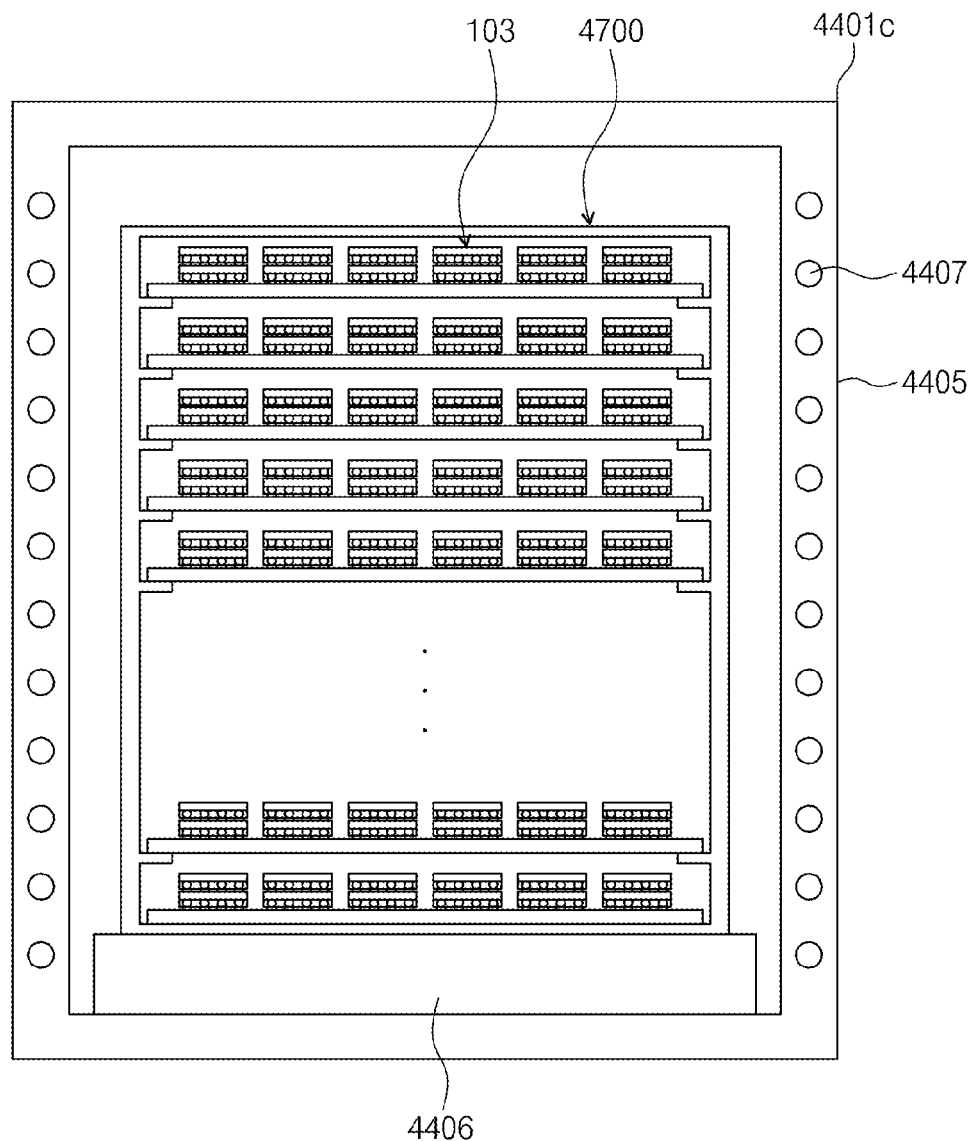
FIG. 52 is a schematic diagram illustrating an example of a post-treatment unit shown in FIG. 51.

Alternatively, the post-treatment unit 4401b may be configured to heat a plurality of treatment substrates at the same time. FIG. 52 is a schematic diagram illustrating an example of a post-treatment unit 4401b of FIG. 51.

Referring to FIG. 52, a post-treatment unit 4401c is configured to receive the container 4700 containing a plurality of pre-treated treatment substrates, and may include a housing 4405, a supporting plate 4406, and a heater 4407. The housing 4405 may be shaped like a case or box and be configured to provide an internal heating space. For example, the housing 4405 may be shaped like a rectangular parallelepiped box. The supporting plate 4406 may be configured to support the container 4700, in which the pre-treated treatment substrates 100 are disposed. The supporting plate 4406 may be shaped like a rectangular plate. The heater 4407 may be configured to heat the internal heating space of the housing 4405, during the curing step S330. In certain examples, the heater 4407 may include heating elements that may be buried in a sidewall of the housing 4405. When the plastic-deformation of the solder 142 is completed in the pre-treatment unit 4401a, the treatment substrate 100 may be transferred to the container 4700. In this particular example, the treatment substrates 100 are stacked one over the other in the container 4700. After containment of the treatment substrates 100, the container 4700 may be moved into the housing 4405 of the post-treatment unit 4401c by an operator or a carrier mechanism. The use of the post-treatment unit 4401b of FIG. 52 may enhance throughput by curing multiple treatment substrates 100 in a batch processing operation.

Figure 53:
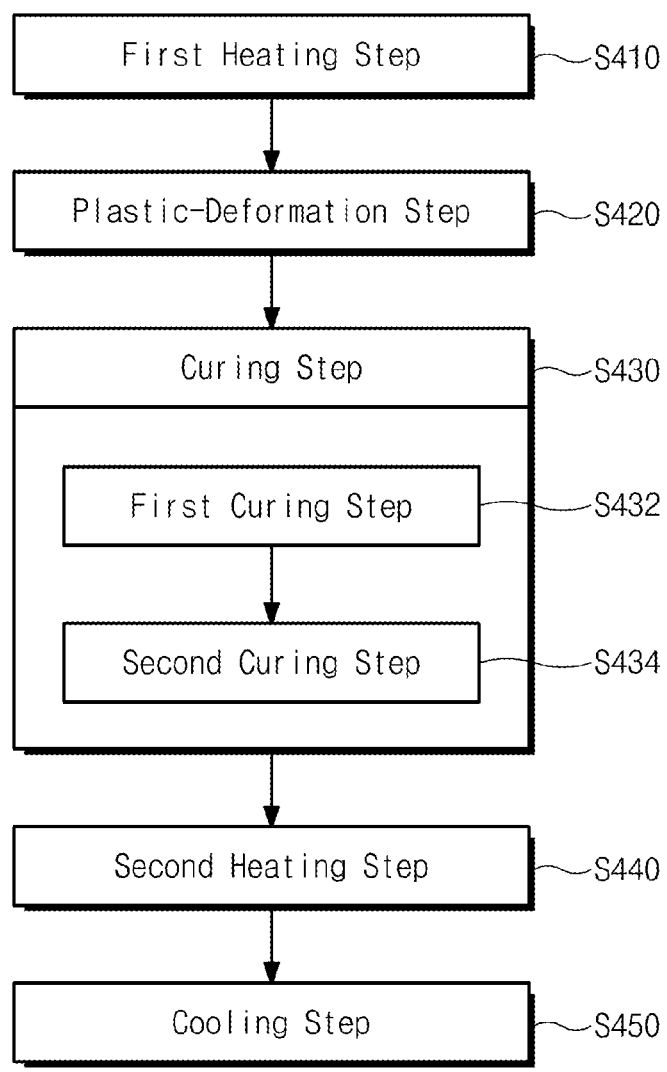
FIG. 53 is a flow chart for reference in describing a bonding process according to other example embodiments of the inventive concept.

FIG. 53 is a flow chart schematically illustrating a bonding process according to other example embodiments of the inventive concept. Referring to FIG. 53, a bonding process may include a first heating step S410, a plastic-deformation step S420, a curing step S430, a second heating step S440, and a cooling step S450. The first heating step S410, the plastic-deformation step S420, the second heating step S440, and the cooling step S450 may be performed in substantially the same or similar manner as the first heating step S310, the plastic-deformation step S320, the second heating step S340, and the cooling step S350, respectively, of FIG. 41 described previously. The curing step S430 of the example of this embodiment includes a first curing step S432 and a second curing step S434. A portion of the NCF 146 may be initially cured in the first curing step S432, and then, the remaining portion of the NCF 146 may be cured in the second curing step S434. Further, the first curing step S432 and the second curing step S432 may be performed using different units. For example, in the case where the system of FIG. 52 is used, the pre-treatment unit 4401a may be configured to perform the first heating step S410, the plastic-deformation step S420, and the first curing step S432 of FIG. 53, and the post-treatment unit 4401b may be configured to perform the second curing step S434 of FIG. 53.

Another embodiment of a bonding process according to one or embodiments of the inventive concept will now be described with reference to the timing diagrams of FIGS. 54 and 55. For simplicity, the bonding process will be described with reference to the treatment substrate of FIG. 42 described previously.

Figure 54:
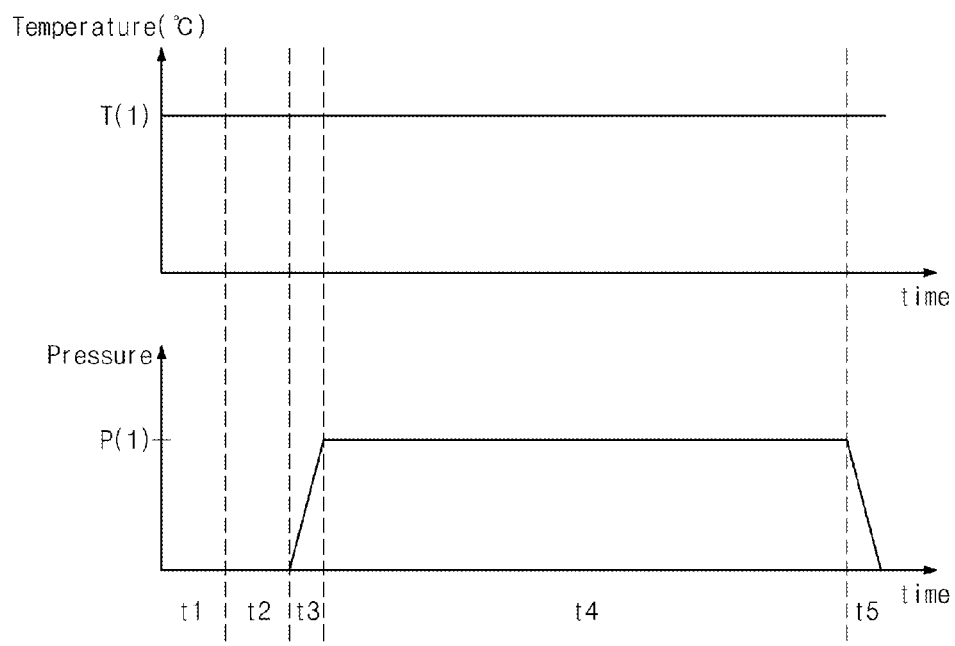
FIGS. 54 and 55 are timing diagrams for reference in describing a bonding process according to other example embodiments of the inventive concept.

Referring to FIG. 54, at time interval t1, the treatment substrate is loaded into a first apparatus having a first constant chamber temperature T(1). At this time, no pressure is exerted on the treatment substrate by upper and lower stages 430 and 440 contained in the first apparatus.

Next, during time interval t2, the non-cured NCF 146 is melted or liquidized by being subjected to the first constant chamber temperature T(1).

Then, during time interval t3, the first constant chamber temperature T(1) is maintained, and a pressure exerted on the treatment substrate is ramped up to a pressure P(1) so as to deform of the electric contact 142. As explained previously by way of various examples, the pressure may be exerted by the upper and lower stages 430 and 440 contained in the first apparatus.

Next, during time interval t4, the pressure P(1) is maintained while the previously melted NCF 146 is polymerized by thermal treatment at the first constant chamber temperature T(1). In this manner, the original non-cured NCF 146 becomes cured NCF 146 surrounding the deformed electric contact 142.

Then, at time interval t5, the treatment substrate is unloaded from the first apparatus.

Figure 55:
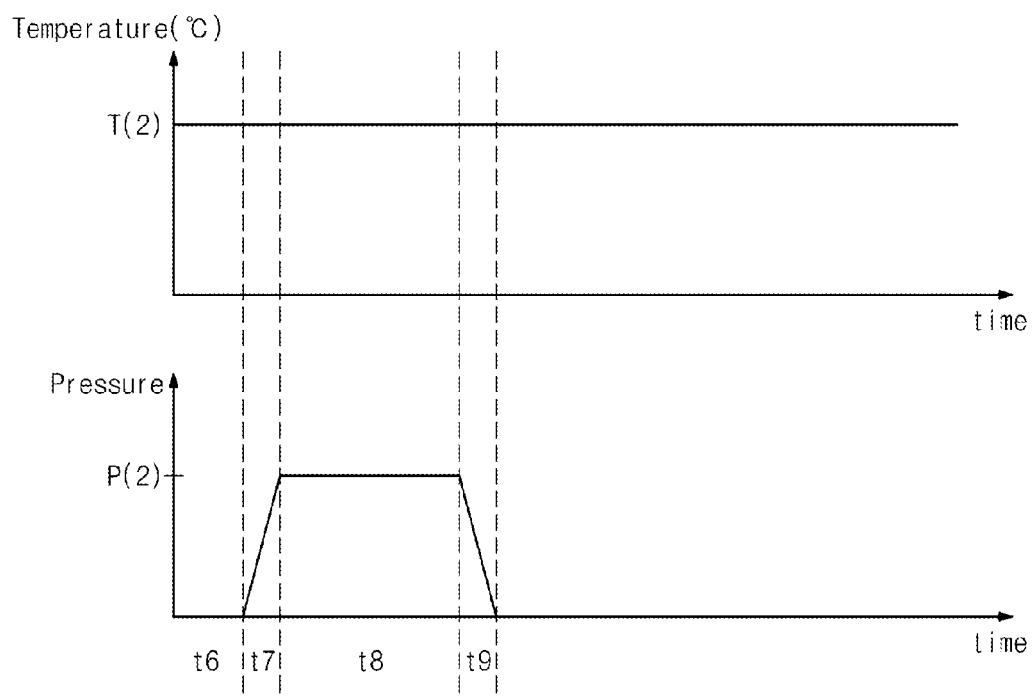

Referring now to FIG. 55, according to this example embodiment, the treatment substrate is loaded into second apparatus having a second constant chamber temperature T(2) during time interval t6. At this time, no pressure is exerted on the treatment substrate by the upper and lower stages 430 and 440 contained in the second apparatus.

Then, during time interval t7, the second constant chamber temperature T(2) is maintained, and a pressure exerted on the treatment substrate is ramped up to a pressure P(2). Again, as explained previously by way of various examples, the pressure may be exerted by upper and lower stages 430 and 440 contained in the second apparatus.

Then, during term interval t8, by operation of the chamber temperature T(2) and the pressure P(2), the electric contact 142 is melted and bonded to the underlying pad 144.

Finally, at time interval t9, the treatment substrate is removed from the second apparatus.

Referring back to FIG. 54, the temperature T(1) and duration of the time interval t4 (curing interval) will depend on the material of the NCF 146. Generally, however, the temperature T(1) may be between 100 and 150° C., both inclusive, and the curing interval t4 may be between 5 and 30 minutes, both inclusive. Also, the temperature T(1) and pressure (P1) are selected to achieve deformation of the electric contact 142, but without melting the electric contact 142.

Referring again to FIG. 55, the temperature T(2) and duration of the time interval t8 (bonding interval) will depend on the material of the electrical contact 142. In the case where the electrical contact 142 is solder, the temperature T(2) may be between 220 and 300° C., both inclusive, and the bonding interval t8 may be about one minute. It can be seen that the bonding interval t8 is substantially less than the curing interval. For example, a ratio of duration of the curing interval t4 to the duration of the bonding interval t8 may be 5:1 and 30:1, both inclusive. Also, the temperature T(2) and pressure (P2) are selected to achieve melting and bonding of the electric contact 142, but without melting the cured NCF 146.

While example embodiments of the inventive concepts have been particularly shown and described, it will be understood by one of ordinary skill in the art that variations in form and detail may be made therein without departing from the spirit and scope of the attached claims.

What is claimed is:

1. A stage configured to exert pressure on upper surfaces of a plurality of semiconductor devices in a processing apparatus, the support stage comprising:
   a support body including a support surface;
   an elastic plate located on the support surface of the support body; and
   an elastic sheet located on the support surface of the support body,
   wherein the support surface includes a plurality of protrusions each having four side surfaces projecting from the support surface towards the elastic sheet, and a rectangular protrusion surface spanning the side surfaces and confronting the elastic sheet, and
   the plurality of protrusions are disposed in an array and are arranged such that the protrusion surfaces respectively align with the upper surfaces of the plurality of semiconductor devices simultaneously processed by the processing apparatus.

2. The stage of claim 1, wherein the processing apparatus is a bonding apparatus.

3. The stage of claim 1, wherein the elastic sheet is a sheet of a rubber material.

4. The stage of claim 1, wherein at least one of the protrusion surfaces has a plurality of indentations therein.

5. The stage of claim 1, wherein the stage has vacuum holes open at the protrusion surfaces of the protrusions, respectively.

6. The stage of claim 5, wherein the stage has additional vacuum holes open at the support surface between the protrusions.

7. The stage of claim 1, wherein the support body has a plurality of indentations in the support surface thereof, and
   the elastic sheet spans the indentations as spaced from respective surfaces defining the bottoms of the indentations, whereby the indentations lie beneath the back surface of the elastic sheet.

8. The stage of claim 1, wherein the support surface is substantially planar and contiguous.

* * * * *